US009829507B2

(12) United States Patent
Saito

(10) Patent No.: US 9,829,507 B2
(45) Date of Patent: Nov. 28, 2017

(54) METHOD OF MANUFACTURING SEMICONDUCTOR DEVICE, AND PROBE CARD

(71) Applicant: RENESAS ELECTRONICS CORPORATION, Tokyo (JP)

(72) Inventor: Takashi Saito, Gunma (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 115 days.

(21) Appl. No.: 15/045,952

(22) Filed: Feb. 17, 2016

(65) Prior Publication Data

US 2016/0247733 A1 Aug. 25, 2016

(30) Foreign Application Priority Data

Feb. 19, 2015 (JP) ................................. 2015-031062

(51) Int. Cl.
| | | |
|---|---|---|
| *G01R 31/302* | (2006.01) | |
| *G01R 1/067* | (2006.01) | |
| *G01R 1/073* | (2006.01) | |
| *G01R 27/08* | (2006.01) | |
| *G01R 31/28* | (2006.01) | |

(Continued)

(52) U.S. Cl.
CPC ....... *G01R 1/0675* (2013.01); *G01R 1/07342* (2013.01); *G01R 27/08* (2013.01); *G01R 31/2889* (2013.01); *H01L 29/66174* (2013.01); *H01L 29/93* (2013.01)

(58) Field of Classification Search
CPC .............. G01R 31/2601; G01R 31/025; G01R 31/2621; G01R 31/2855; G01R 31/2896; G01R 31/2874; G01R 31/26; G01R 31/2607; G01R 31/12; G01R 31/3187; G01R 31/318371; G01R 31/318547; G01R 31/31703; G01R 31/31727; G01R 31/31724
USPC .............. 324/551, 760, 765, 750.05, 762.01, 324/762.05, 760.01–763.01, 719, 71.5, 324/757.01–757.05; 29/650, 825, 829, 29/846, 849; 714/733, 738, 718, 735
See application file for complete search history.

(56) References Cited

U.S. PATENT DOCUMENTS

| | | | | |
|---|---|---|---|---|
| 5,517,110 A | * | 5/1996 | Soiferman | ........... G01R 31/315 324/538 |
| 5,999,005 A | * | 12/1999 | Fujii | ...................... G01R 1/071 324/754.23 |

(Continued)

FOREIGN PATENT DOCUMENTS

JP   03-144895 A   6/1991

*Primary Examiner* — Jermele M Hollington
*Assistant Examiner* — Taqi Nasir
(74) *Attorney, Agent, or Firm* — McDermott Will & Emery LLP

(57) ABSTRACT

Reliability of an electrical test of a semiconductor wafer is improved. A method of manufacturing a semiconductor device includes a step of performing an electrical test of a semiconductor element by allowing contact portions (tips) of a force terminal (contact terminal) and a sense terminal (contact terminal) held by a probe card (first card) to come into contact with an electrode terminal of a semiconductor wafer. In the step of performing the electrical test, the contact portions of the force terminal and the sense terminal move in a direction away from each other after coming into contact with the first electrode terminal.

15 Claims, 16 Drawing Sheets

(51) Int. Cl.
*H01L 29/66* (2006.01)
*H01L 29/93* (2006.01)

(56) References Cited

U.S. PATENT DOCUMENTS

| | | | | |
|---|---|---|---|---|
| 6,369,590 | B1* | 4/2002 | Cugini | G01R 31/309 |
| | | | | 324/754.21 |
| 6,369,591 | B1* | 4/2002 | Cugini | G01R 31/309 |
| | | | | 324/750.14 |
| 7,046,020 | B2* | 5/2006 | LaMeres | G01R 1/07314 |
| | | | | 324/754.07 |
| 7,112,967 | B2* | 9/2006 | Tsuji | G01R 31/309 |
| | | | | 324/501 |
| 2006/0208721 | A1* | 9/2006 | Soeta | G01R 31/2865 |
| | | | | 324/750.05 |
| 2007/0182433 | A1* | 8/2007 | Natsuhara | G01R 31/2877 |
| | | | | 324/750.03 |
| 2008/0018353 | A1* | 1/2008 | Thamarayoor | G01R 1/0483 |
| | | | | 324/756.02 |
| 2009/0058445 | A1* | 3/2009 | Leon | G01R 1/06738 |
| | | | | 324/757.02 |
| 2010/0201386 | A1* | 8/2010 | Roelvink | G01R 31/2808 |
| | | | | 324/756.07 |

* cited by examiner ously come into contact with one electrode terminal. On the other hand, when a contact terminal, which is structured in such a manner that tip portions of two contact terminals are jointed, is allowed to come into contact with an electrode terminal, measurement results are inevitably affected by contact resistance between the contact terminal and the electrode terminal as in the case where two independent contact terminals are each allowed to come into contact with the electrode terminal. It is therefore required to provide a technique that allows two independent contact terminals to come into contact with a small electrode terminal.

METHOD OF MANUFACTURING SEMICONDUCTOR DEVICE, AND PROBE CARD

CROSS-REFERENCE TO RELATED APPLICATIONS

The disclosure of Japanese Patent Application No. 2015-031062 filed on Feb. 19, 2015 including the specification, drawings and abstract is incorporated herein by reference in its entirety.

BACKGROUND

The present invention relates to a manufacturing technology of a semiconductor device. For example, the invention relates to a technology that is effectively applicable to a method of manufacturing a semiconductor device, the method including a step of performing an electrical test for determining electrical properties of a semiconductor element formed in a semiconductor wafer.

Japanese Unexamined Patent Application Publication No. Hei 3(1991)-144895 describes a probe to be in contact with a bonding pad of a semiconductor element. The probe is structured to be bifurcated from an integrally formed tip portion.

SUMMARY

A method of performing an electrical test for determining electrical properties of a semiconductor chip includes a test method in which two types of contact terminals for current supply and for voltage measurement are allowed to come into contact with one electrode terminal of the semiconductor chip. However, a planar size of one electrode terminal is reduced with a reduction in size of the semiconductor chip or an increase in the number of electrode terminals, and there is required a technique for allowing two contact terminals to simultaneously come into contact with one electrode terminal. On the other hand, when a contact terminal, which is structured in such a manner that tip portions of two contact terminals are jointed, is allowed to come into contact with an electrode terminal, measurement results are inevitably affected by contact resistance between the contact terminal and the electrode terminal as in the case where two independent contact terminals are each allowed to come into contact with the electrode terminal. It is therefore required to provide a technique that allows two independent contact terminals to come into contact with a small electrode terminal.

Other issues and novel features will be clarified from the description of this specification and the accompanying drawings.

According to one embodiment of the invention, there is provided a method of manufacturing a semiconductor device, the method including a step of performing an electrical test of a semiconductor element by allowing tip portions of a first contact terminal and a second contact terminal held by a first card to come into contact with a first electrode terminal of a semiconductor wafer. In the step of performing the electrical test, the tip portions of the first contact terminal and the second contact terminal move in a direction away from each other after coming into contact with the first electrode terminal.

According to the one embodiment, reliability of the electrical test can be improved.

DETAILED DESCRIPTION

Description Format in this Application

Figure 1:
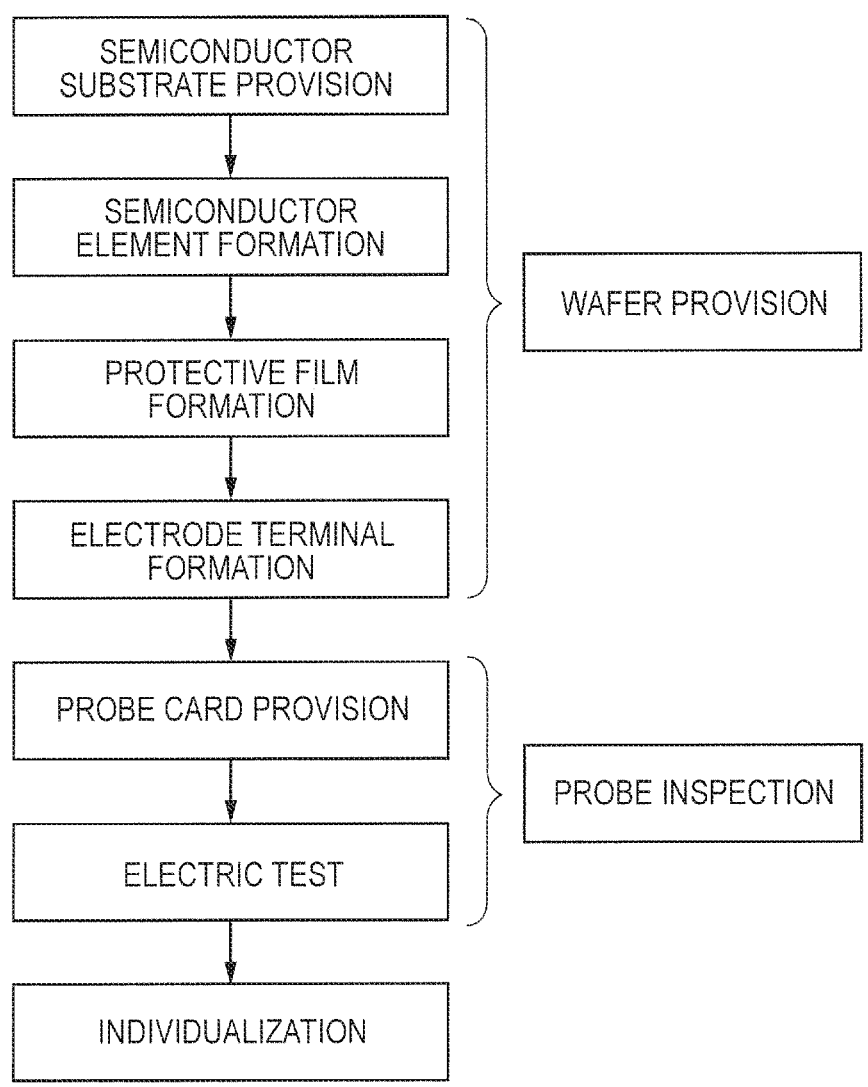
FIG. 1 is a schematic illustration illustrating an outline of a manufacturing procedure of a semiconductor device of one embodiment.

Although the embodiment in this application may be dividedly described in a plurality of sections for convenience as necessary, they are not independent of one another and are each apart of one example, or a detail, a modification, or the like of part or all of another one irrespective of before or after the description, except for the case where they are particularly defined to be independent. In principle, like portions are not repeatedly described.

The components in the embodiment are not indispensable except for the case where they are particularly defined to be indispensable, the case where the number of them is theoretically limited to the relevant number, and the case where they each are clearly indispensable from the context. In the drawings in the embodiment, equivalent or like portions are designated by equivalent or like symbols or numerals, and duplicated description is not performed in principle.

In each of the accompanying drawings, a sectional diagram may not be hatched if the drawing becomes complicated by such hatching, or a space is clearly distinguishable. In relation to this, a background outline of a planarly closed hole may also be omitted if the outline is clearly recognized from description or the like. Furthermore, a view other than a sectional view may also be hatched or dot-patterned to indicate that the relevant portion is not a space, or indicate a boundary of a region.

In this embodiment, there is described a method of manufacturing a semiconductor device having a semiconductor element called varicap diode as an exemplary semiconductor device. The varicap diode, a type of diode, is a semiconductor element, of which the capacitance varies depending on a voltage applied to a terminal thereof. The varicap diode is used as a variable capacitor, for example.

Method of Manufacturing Semiconductor Device

Figure 2:
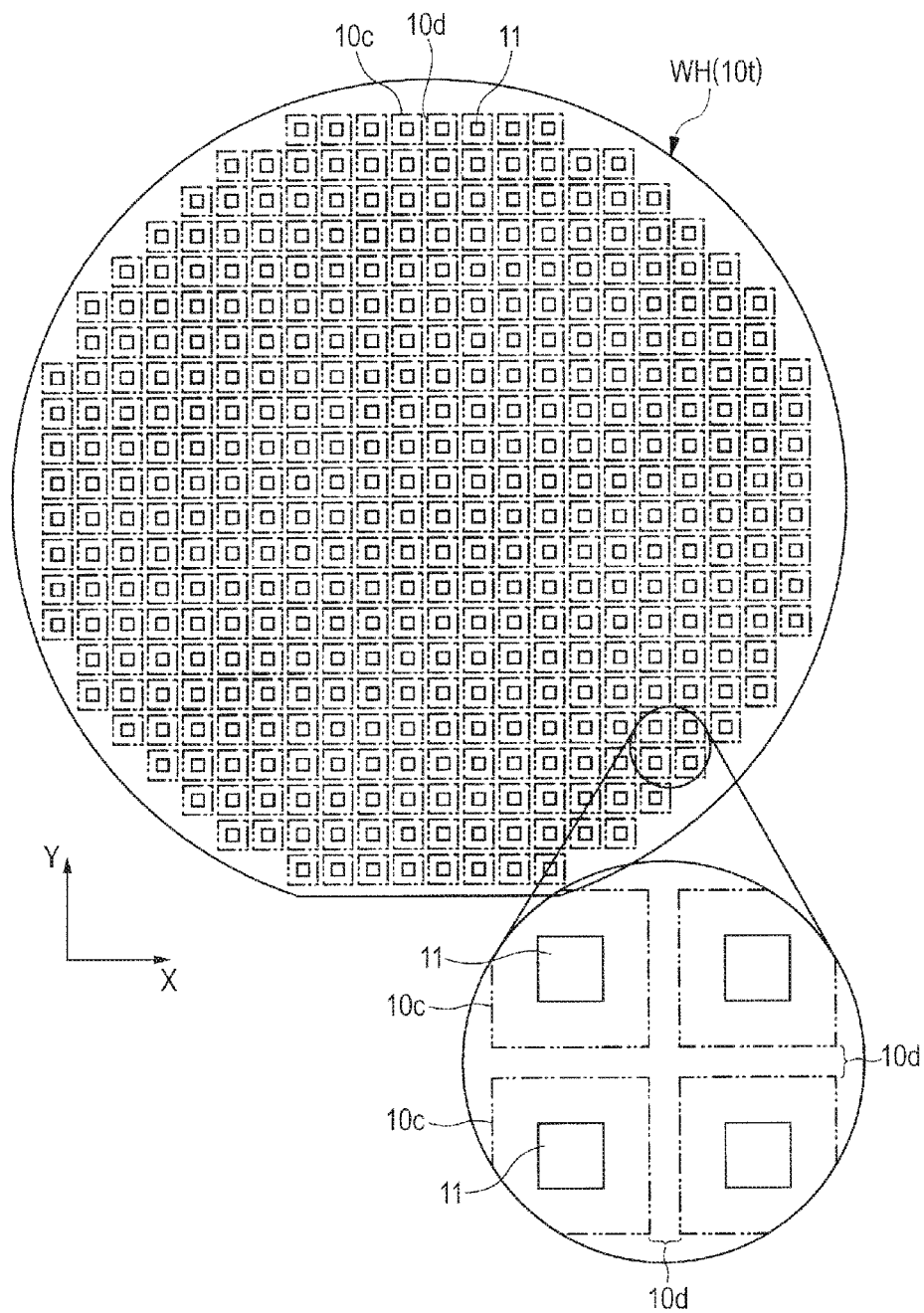
FIG. 2 is a plan view illustrating a top surface of a semiconductor wafer provided in the wafer provision step illustrated in FIG. 1.
Figure 3:
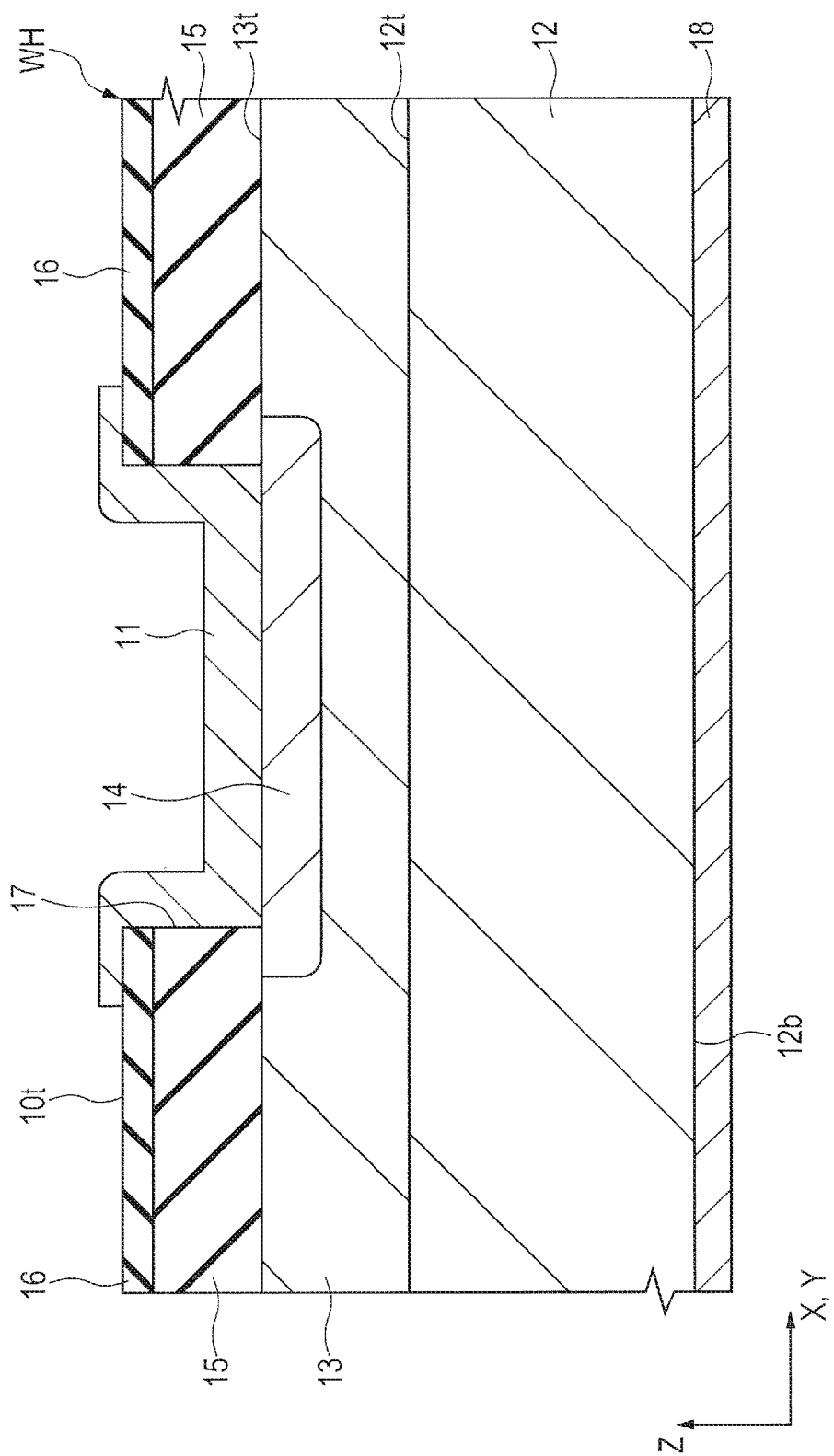
FIG. 3 is an expanded sectional view of part of the semiconductor wafer illustrated in FIG. 2.
Figure 4:
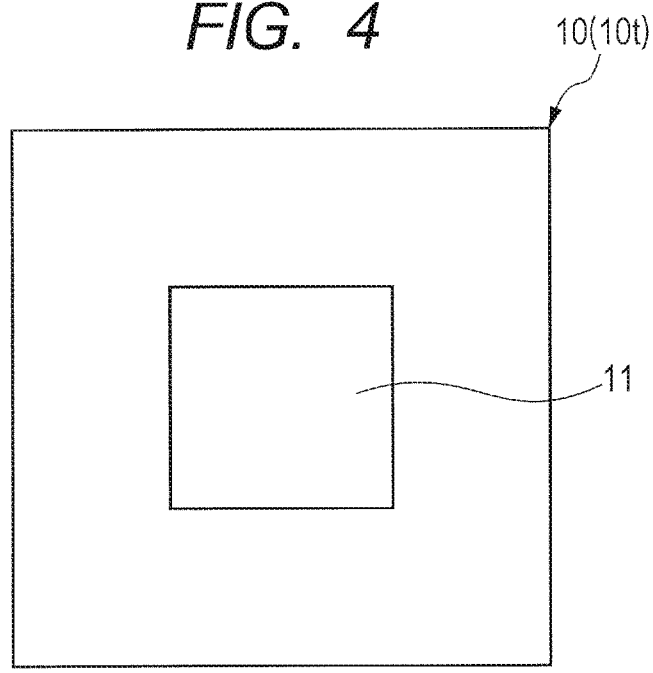
FIG. 4 is a plan view illustrating a top surface of one of a plurality of semiconductor chips provided in the individualization step illustrated in FIG. 1.
Figure 5:
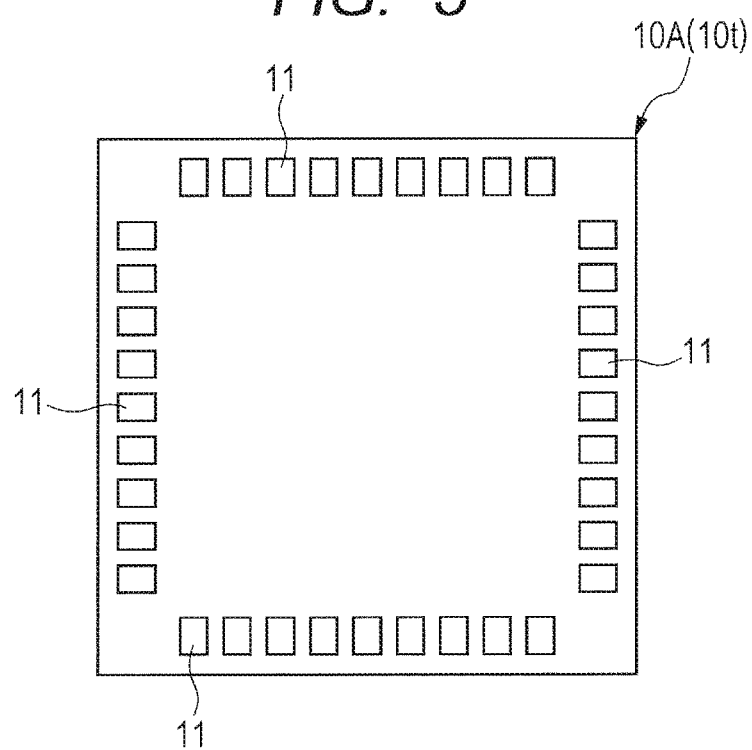
FIG. 5 is a plan view illustrating a top surface of a semiconductor chip as a modification of the semiconductor chip of FIG. 4.

A general procedure of a method of manufacturing semiconductor device of this embodiment is now described with reference to FIGS. 1 to 5. FIG. 1 is a schematic illustration illustrating an outline of a manufacturing procedure of the semiconductor device of this embodiment. FIG. 2 is a plan view illustrating a top surface of a semiconductor wafer provided in the wafer provision step illustrated in FIG. 1. FIG. 3 is an expanded sectional view of part of the semiconductor wafer illustrated in FIG. 2. FIG. 4 is a plan view illustrating a top surface of one of a plurality of semiconductor chips provided in the individualization step illustrated in FIG. 1. FIG. 5 is a plan view illustrating a top surface of a semiconductor chip as a modification of the semiconductor chip of FIG. 4.

In the wafer provision step shown in FIG. 1, as illustrated in FIG. 2, there is provided a wafer (semiconductor wafer) WH that is partitioned into a plurality of chip regions 10c. The planar shape of a wafer WH is a substantially circular shape (in detail, having a cutout such as a notch or an oriental flat in the periphery to recognize a crystal orientation).

The chip regions 10c, each chip region corresponding to one semiconductor chip, are provided on the main surface of the wafer WH. In FIG. 2, planar size of one chip region 10c is shown in an expanded manner for viewability, and 392 chip regions 10c are provided. However, this configuration can be applied to the case where the number of chip regions 10c is larger than that in FIG. 2. While the number of chip regions 10c on one wafer WH varies depending on the planar size of the chip region 10c, for example, about tens of thousands to hundreds of thousands of chip regions 10c are often provided. Each of the chip regions 10c on the wafer WH has a semiconductor integrated circuit therein, and has an electrode terminal (an electrode, a chip electrode, a pad) 11 to be electrically coupled to the semiconductor integrated circuit on the main surface.

An exemplary method of forming the wafer WH illustrated in FIG. 2 is briefly described with reference to FIG. 3. For example, the wafer WH is formed as follows. First, a semiconductor substrate 12 having a main surface (device formation surface) 12t is provided in the semiconductor substrate provision step (see FIG. 1). Subsequently, a semiconductor element is formed on the main surface 12t of the semiconductor substrate 12 in the semiconductor element formation step (see FIG. 1.) In the exemplary case illustrated in FIG. 3, a varicap diode element is formed.

For example, the varicap diode element is formed as follows. The semiconductor substrate 12 illustrated in FIG. 3 is configured of a substrate including, for example, silicon (Si) doped with an impurity (for example, antimony (Sb)) of a first conductivity type (for example, n type). The concentration of the impurity introduced in the semiconductor substrate 12 being an n-type high-concentration substrate is about $1 \times 10^{19}$ to $1 \times 10^{20}/cm^3$, for example.

Subsequently, a semiconductor layer 13 is deposited on the main surface 12t of the semiconductor substrate 12. The semiconductor layer 13 is doped with an impurity of the same conductivity type as that of the semiconductor substrate 12 at a concentration lower than the semiconductor substrate 12. For example, the semiconductor layer 13 is formed through epitaxial growth of an n-type silicon layer doped with an impurity having an n-type conductivity (for example, phosphor (P)). The semiconductor layer 13 has a resistivity of about 100 Ω·cm or more, and a dopant concentration of, for example, about $1 \times 10^{16}$ to $1 \times 10^{19}/cm^3$.

Subsequently, a semiconductor region 14 having a conductivity type (for example, p type) opposite to that of the semiconductor layer 13 is formed on a surface (surface 13t) of the semiconductor layer 13 on a side opposite to the surface opposed to the main surface 12t of the semiconductor substrate 12. The semiconductor region 14 is formed as follows, for example. First, the semiconductor substrate 12 having the semiconductor layer 13 is subjected to thermal oxidation treatment to form an undepicted silicon oxide film on the surface 13t of the semiconductor layer 13. Subsequently, an undepicted photoresist film is formed on the silicon oxide film, and is then patterned by a photolithography technique to form an opening. Subsequently, the silicon oxide film is etched with the remaining photoresist film as a mask, so that an opening is selectively formed in the silicon oxide film on the surface of the semiconductor layer 13. Subsequently, a doping material such as a poly boron film (PBF) is applied onto the semiconductor layer 13 including the opening. Subsequently, the semiconductor substrate 12 is annealed in an atmosphere of about 900° C., thereby boron (B) as a p-type impurity is introduced in the semiconductor layer 13 to form the semiconductor region 14 in which the p-type impurity is thermally diffused. Subsequently, the semiconductor substrate 12 is heat-treated at about 1000° C. in a nitrogen ($N_2$) atmosphere to form a PN junction of the p-type semiconductor region 14 and the n-type semiconductor layer 13, so that a diode element is formed.

Subsequently, in the protective-film formation step illustrated in FIG. 1, an insulating film as a protective film is deposited on the semiconductor substrate 12 having the diode elements therein. In the exemplary case illustrated in FIG. 3, a silicon oxide film (insulating film) 15 is deposited on the surface 13t of the semiconductor layer 13, and then a phospho silicate glass (PSG) film 16 is deposited by a CVD process, for example.

Subsequently, in the electrode terminal formation step illustrated in FIG. 1, an electrode terminal 11 to be coupled to the diode element is formed as illustrated in FIG. 3. The electrode terminal 11 is formed, for example, as follows. The PSG film 16 and the silicon oxide film 15 are dry-etched with an undepicted photoresist film patterned by a photolithography technique to form an opening 17 that runs up to the semiconductor region 14. Subsequently, a metal film is evaporated onto the semiconductor substrate 12 including the inside of the opening 17. In this embodiment, for example, an alloy film including aluminum (Al) and silicon (Si) is formed by evaporation. Subsequently, the alloy film including Al and Si is etched with a photoresist film as a mask to form the electrode terminal 11.

In the exemplary case illustrated in FIG. 3, a back surface electrode 18 is provided on a back surface 12b, which is on a side opposite to the main surface 12t, of the semiconductor substrate 12. The back surface electrode 18 is formed by depositing a metal film on the back surface 12b of the semiconductor substrate 12. The metal film deposited on the back surface 12b may be a multilayered metal film including, for example, gold (Au), antimony (Sb), and Au deposited in this order.

Through these steps, the semiconductor element and the electrode terminal 11 are formed in each of the chip regions 10c of the wafer WH illustrated in FIG. 2. While the outline of the wafer provision step illustrated in FIG. 1 has been briefly described hereinbefore, it will be appreciated that the wafer provision step can be variously modified. For example, if the thickness of the semiconductor wafer WH must be decreased, a back surface polishing step, in which the back surface of the semiconductor substrate 12 is polished, may be performed before formation of the back surface electrode 18.

In the exemplary case illustrated in FIG. 4, the semiconductor chip 10 has one electrode terminal 11 in the center of its top surface 10t. However, the arrangement pattern of the electrode terminals 11 may include various modified patterns. For example, a plurality of electrode terminals 11 may be arranged along the sides of the top surface 10t having a quadrilateral shape as with a semiconductor chip 10A illustrated in FIG. 5. In the exemplary case illustrated in FIG. 3, there is shown an embodiment in which the electrode terminal 11 is directly coupled to the semiconductor element. In a possible modification, for example, the electrode terminal 11, which is exposed on the top surface 10t of the semiconductor chip 10, is electrically coupled to the semiconductor element via one or more interconnection layers (not shown) provided on the semiconductor substrate 12.

Subsequently, an electrical test of the wafer WH illustrated in FIG. 2 is performed in the probe inspection step illustrated in FIG. 1. As illustrated in FIG. 1, the probe inspection step includes the probe card provision step and the electrical test step. In an embodiment shown in FIG. 1, the probe inspection step is separately performed after the wafer provision step for convenience of description. However, the probe inspection step may be performed during the wafer provision step. For example, electrical properties of the semiconductor element can be tested after the semiconductor element formation step.

Subsequently, in the individualization step illustrated in FIG. 1, the wafer WH illustrated in FIG. 2 is divided into the chip regions 10c, so that a plurality of semiconductor chips (semiconductor devices) 10 illustrated in FIG. 4 are provided. In this step, for example, the wafer WH is cut along scribed regions 10d arranged between the chip regions 10c illustrated in FIG. 2, and is thus individualized into the chip regions 10c. Through such steps, the semiconductor chip 10 as the semiconductor device of this embodiment is provided. Although there have been described outlines of the main steps among the steps for manufacturing the semiconductor chip, the steps can be variously modified.

Inspection Apparatus

Figure 6:
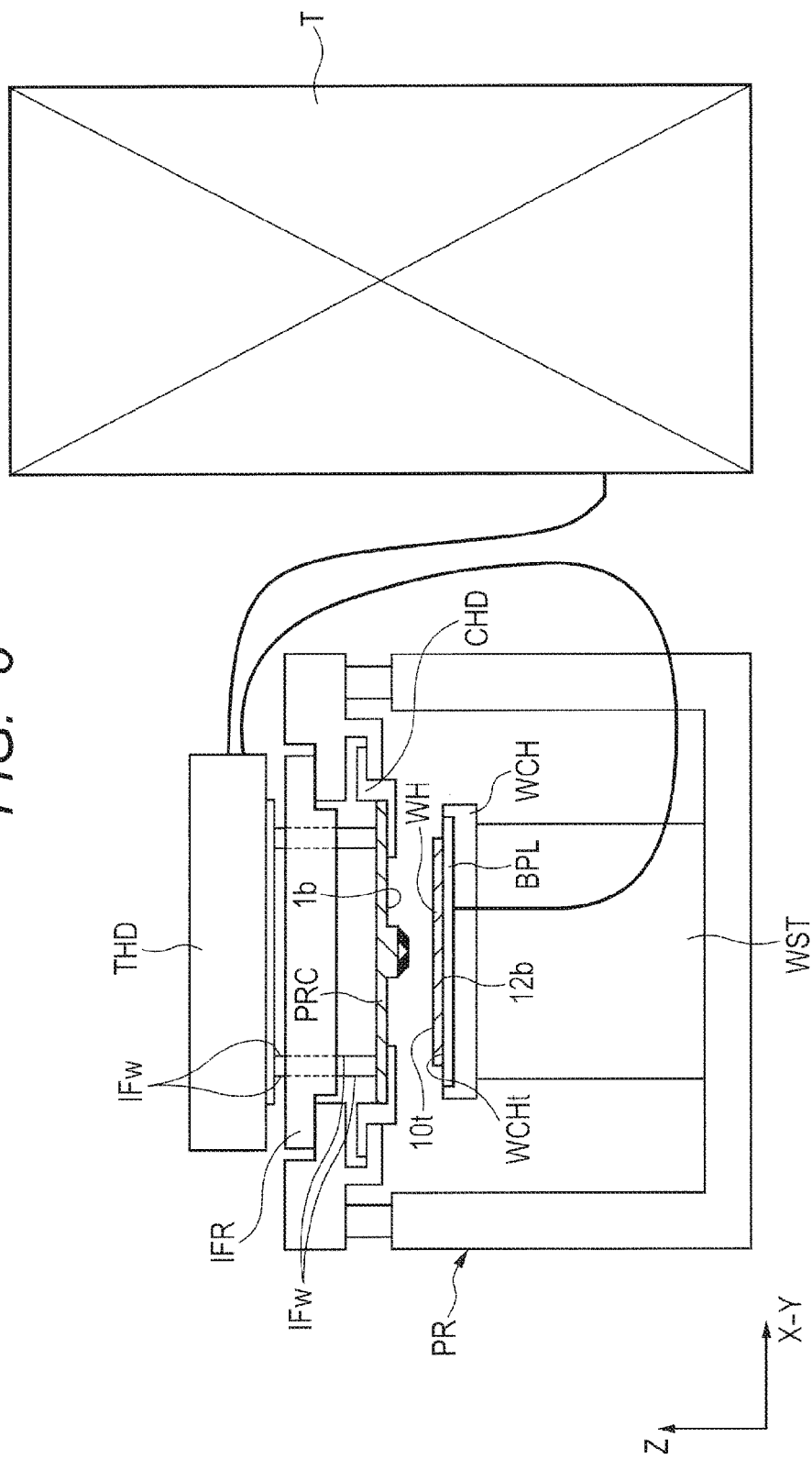
FIG. 6 is a schematic illustration schematically illustrating a general configuration of an inspection apparatus used in a probe inspection step illustrated in FIG. 1.
Figure 7:
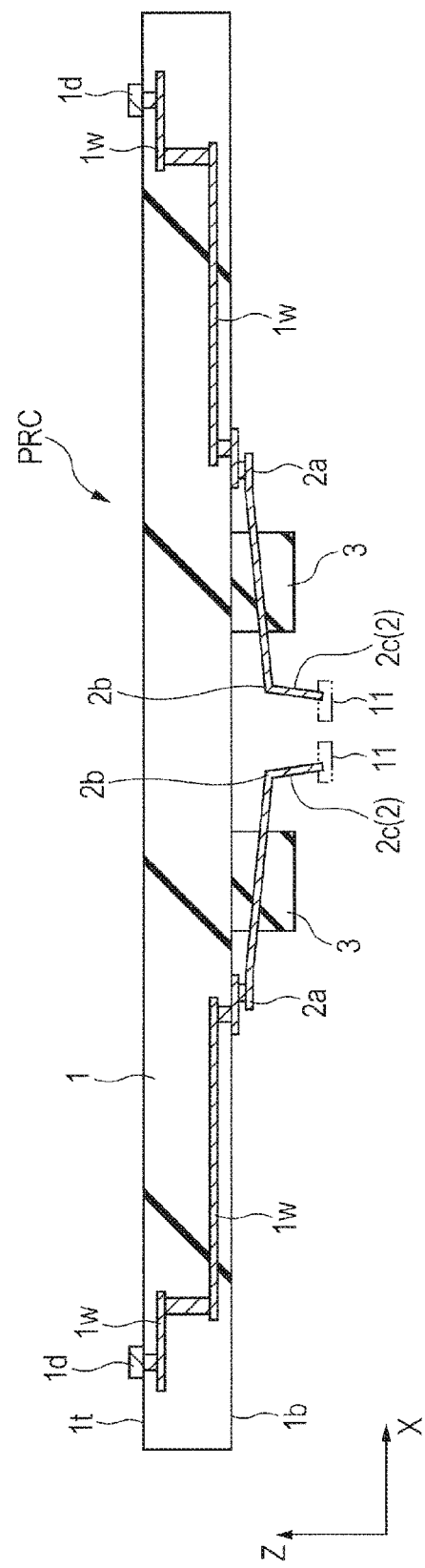
FIG. 7 is a sectional view schematically illustrating a structure of a probe card illustrated in FIG. 6.
Figure 8:
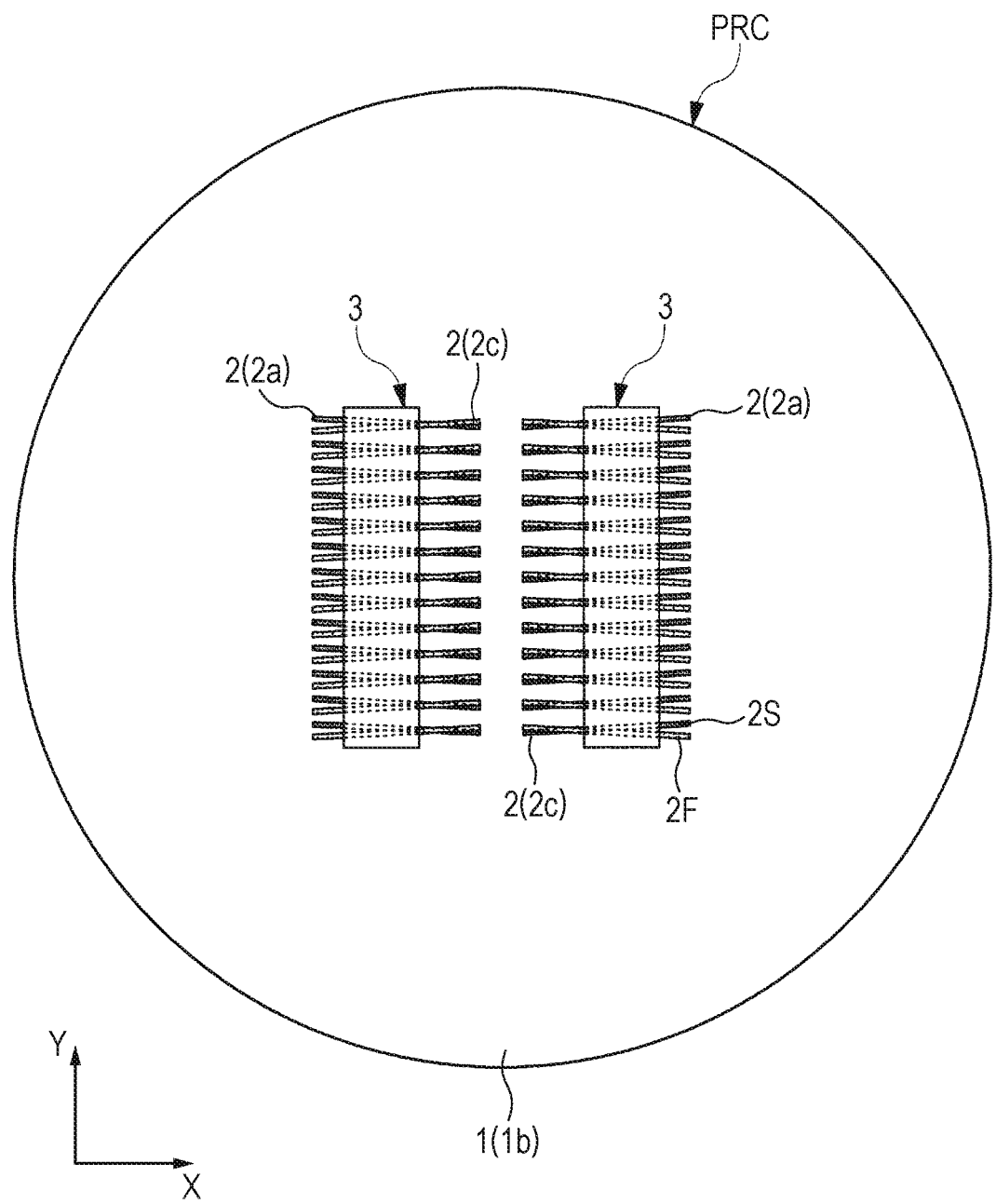
FIG. 8 is a plan view schematically illustrating a wafer-opposed surface (bottom surface) of the probe card illustrated in FIG. 6.

The outline of the inspection apparatus used in the probe inspection step illustrated in FIG. 1 is now described. FIG. 6 is a schematic illustration schematically illustrating a general configuration of the inspection apparatus used in the probe inspection step illustrated in FIG. 1. FIG. 7 is a sectional view schematically illustrating a structure of a probe card illustrated in FIG. 6. FIG. 8 is a plan view schematically illustrating a wafer-opposed surface (bottom surface) of the probe card illustrated in FIG. 6. In the exemplary case illustrated in FIGS. 7 and 8, a decreased number of probe needles 2 are shown for better viewability. However, since the probe needles 2 are individually provided in correspondence to the number of the electrode terminals 11 to be collectively inspected in the electrical test step illustrated in FIG. 1, the actual number of the probe needles 2 is larger than that illustrated in FIG. 7 or 8.

As illustrated in FIG. 6, the prober (inspection apparatus) PR of this embodiment is comprised of a probe card PRC, a tester head THD, an interface ring IFR, a card holder CHD, a wafer stage WST, and a wafer chuck (wafer holding stage) WCH. The tester head THD is electrically coupled to the interface ring IFR through wirings IFw. In addition, the interface ring IFR is electrically coupled to the probe card PRC through wirings IFw. Consequently, the tester head THD is electrically coupled to the probe card PRC. For example, a conductive member called POGO pin or spring probe can be used as the wirings IFw. The POGO pin or the spring probe is a contact needle, which is structured such that a contact pin (plunger (contact needle) is pressed to an electrode (terminal) by elastic force of a spring (coil spring) and thus electrically coupled to the electrode as necessary. For example, the contact needle has a configuration where a spring arranged in a metal tube (holding member) transmits elastic force to a contact pin via a metal ball. The tester head THD is electrically coupled to a tester T that supplies a voltage and a signal current necessary for a probe inspection to the tester head THD.

The card holder CHD mechanically couples the probe card PRC to a prober PR, and has a sufficient mechanical strength to prevent a warp of the probe card PRC due to pressure during the electrical test. The wafer stage WST is arranged in a housing of the prober PR, and a wafer chuck WCH as the wafer holding stage is fixedly arranged on the wafer stage WST.

The wafer WH to be inspected is held by the wafer chuck WCH while the top surface 10t (see FIG. 2) having the electrode terminals 11 (see FIG. 2) thereon is opposed to the probe card PRC. The wafer chuck WCH holds the wafer WH by absorption, for example.

In the exemplary case illustrated in FIG. 6, the wafer holding surface (top surface) of the wafer chuck WCH has thereon an inspection surface electrode (back surface electrode, inspection terminal) BPL as an inspection terminal for the back surface electrode 18 to be conducted to the back surface electrode 18 (see FIG. 3). In the electrical test step illustrated in FIG. 1, the inspection surface electrode BPL is electrically coupled to the back surface electrode 18 provided on the back surface 12*b* of the semiconductor substrate 12 illustrated in FIG. 3. The tester head THD is electrically coupled to the inspection surface electrode BPL. In a modification, the back surface electrode 18 illustrated in FIG. 3 is not provided on the semiconductor wafer. When such a semiconductor wafer is tested, the inspection surface electrode BPL illustrated in FIG. 6 may not be provided.

As described above, since the wafer WH has a large number of chip regions 10*c* (see FIG. 2) thereon, it is difficult to collectively inspect all the chip regions 10*c*. In the electrical test step illustrated in FIG. 1, therefore, the main surface of the wafer WH is partitioned into a plurality of inspection areas, and the electrical test is performed for each of the inspection areas while a relative position between the probe card PRC and the wafer WH is moved.

A method of moving the relative position between the probe card PRC and the wafer WH includes a method of moving one or both of the probe card PRC and the wafer WH. In the structure of this embodiment, an undepicted drive section attached to the wafer stage WST is operated, thereby the wafer chuck WCH that fixes the wafer WH is moved in a planar direction (an X-Y plane direction illustrated in FIG. 6) together with the wafer stage WST A structure of moving the wafer chuck WCH as in this embodiment is preferred from the viewpoint of suppressing misalignment due to the moved probe card PRC.

The inspection area may not correspond to one chip region 10*c*. For example, one inspection area may contain a plurality of chip regions 10*c*. There has been described an embodiment where the wafer stage WST is moved together with the wafer chuck WCH. In a structure of a possible modification, however, the wafer chuck WCH is moved independent of the wafer stage WST being unmovable.

The structure of the probe card PRC illustrated in FIG. 6 is now described. As illustrated in FIG. 7, the probe card PRC includes an interconnection substrate 1 having a top surface 1*t*, a bottom surface 1*b* located on a side opposite to a top surface 1*t* side, and a plurality of interconnections 1*w* that electrically couple the top surface it to the bottom surface 1*b*. The bottom surface 1*b* of the interconnection substrate 1 corresponds to a contact terminal disposition surface of the probe card PRC, and has at its center a plurality of probe needles (contact terminals, contactors) 2 that are contact terminals for contact with the individual electrode terminals 11 (see FIG. 4). The top surface 1*t* of the interconnection substrate 1 is a back surface, which is located on a side opposite to the contact terminal disposition surface of the probe card PRC.

The interconnections 1*w* provided on the interconnection substrate 1 are electrically coupled to the probe needles 2 on the bottom surface 1*b* side of the interconnection substrate 1. The top surface 1*t* of the interconnection substrate 1 has thereon a plurality of terminals 1*d*, which are to be electrically coupled to the wirings IFw illustrated in FIG. 6, and are electrically coupled to the interconnections 1*w*. The terminals 1*d* are to be coupled to the wirings IFw (see FIG. 6) that receive or output signals between the tester head THD (see FIG. 6) and the probe card PRC. Specifically, the terminals 1*d* serve as external terminals of the probe card PRC, and each of the probe needles 2 illustrated in FIG. 7 is electrically coupled to an undepicted circuit for the electrical test provided in the tester head THD illustrated in FIG. 6 through each of the interconnections 1*w* provided in the interconnection substrate 1.

As illustrated in FIG. 8, the center of the bottom, surface 1*b* of the interconnection substrate 1 has thereon needle retainers (contact terminal fixing sections) 3 that fix root portions of the probe needles 2. The needle retainers 3 are each a member including, for example, resin. As illustrated in FIG. 7, part of the probe needles 2 are sealed by the needle retainer 3. In detail, a wiring connection 2*a* provided at one end of each probe needle 2 is coupled to the interconnection 1*w*, and a contact portion (tip portion) 2*c* provided at the other end is exposed from the needle retainer 3. The probe needle 2 has a folded portion 2*b* between the wiring connection 2*a* and the contact portion 2*c*, and is bended such that the contact portion 2*c* extends in a direction toward the wafer WH illustrated in FIG. 6. The folded portion 2*b* is exposed from the needle retainer 3. In the electrical test step illustrated in FIG. 1, the contact portion 2*c* being a tip portion of the probe needle 2 is brought into contact with the electrode terminal 11 illustrated in FIG. 4, thereby the probe needle 2 is electrically coupled to the electrode terminal 11.

While described later in detail, in the electrical test step illustrated in FIG. 1, a characteristic test of the semiconductor element is performed with a connection method (hereinafter referred to as Kelvin connection method), in which two types of probe needles for current supply and for voltage measurement are brought into contact with one electrode terminal of a semiconductor chip. Hence, each of the probe needles 2 has a sense terminal (voltage measurement contact terminal) 2S and a force terminal (current supply contact terminal) 2F that are adjacently provided.

Electrical Test Step

The electrical test step illustrated in FIG. 1, which is performed using the prober PR illustrated in FIG. 6, is now described. In the electrical test step illustrated in FIG. 1, as illustrated in FIG. 6, the wafer WH described using FIGS. 2 to 4 is fixed onto the wafer chuck WCH. The wafer chuck WCH has an absorption function, and holds the wafer WH by absorption while the back surface 12*b*, which is located on a side opposite to the top surface 10*t* of the wafer WH, is opposed to the wafer holding surface WCHt of the wafer chuck WCH.

In the electrical test step illustrated in FIG. 1, the probe card PRC and the wafer WH are arranged such that the bottom surface 1*b* of the probe card PRO is opposed to the top surface 10*t* of the wafer WH. The card holder CHD provided in the prober PR and the probe card PRO are fixed by, for example, screwing, and thereby the probe card PRC is held while the bottom surface 1*b* is opposed to the wafer WH.

The step of fixing the wafer WH onto the wafer chuck WCH and the step of holding the probe card PRC by the card holder CHD may be performed in either order without limitation. For example, when the electrical test is continuously performed while the wafer WH is successively changed, the wafer WH is changed while the probe card PRC is held by the card holder CHD.

Subsequently, while the bottom surface 1*b* being the contact terminal disposition surface of the probe card PRC is opposed to the top surface 10*t* of the wafer WH to be inspected, the probe needles 2 are brought into contact with the electrode terminals 11 (see FIG. 7) to test the electrical properties of each semiconductor element provided in the wafer WH. The test of the electrical properties of the semiconductor element includes not only the test of the electrical properties of the semiconductor element itself but also an electrical test of a circuit coupled to the semiconductor element.

From the viewpoint of reducing time required for the electrical test step, it is preferred to collectively inspect the chip regions 10c (see FIG. 2) provided on the top surface 10t side of the wafer WH. In consideration of a routing space of the interconnections 1w to be electrically coupled to the probe needles 2 however, it is difficult to collectively inspect all the chip regions 10c provided on one wafer WH. In the electrical test step, therefore, it is preferred that the top surface 10t of the wafer WH illustrated in FIG. 2 is partitioned into a plurality of inspection areas, and the electrical test is in turn performed for each of the inspection areas while a relative position between the probe card PRC and the wafer WH illustrated in FIG. 6 is moved.

To inspect the electrical properties of the semiconductor element, as illustrated in FIG. 7, the probe needles 2 of the probe card PRC are electrically coupled to the electrode terminals 11 so that a signal current for the test is applied to the semiconductor element provided in the wafer WH (see FIG. 6).

The probe needles 2 are electrically coupled to the electrode terminals 11 in the following way. In the electrical test step illustrated in FIG. 1, first, a distance between the probe card PRC and the wafer WH illustrated in FIG. 6 is reduced so that the probe needles 2 and the electrode terminals 11 illustrated in FIG. 7 are individually brought into contact with each other.

The method of reducing the distance between the probe card PRC and the wafer WH includes, but not limited to, a method in which the wafer chuck WCH illustrated in FIG. 6 is raised in a height direction (the Z direction shown in FIG. 6), a method in which the probe card PRC is lowered in the height direction, and a method as a combination of such two methods, for example. In this embodiment, for example, the wafer chuck WCH illustrated in FIG. 6 is raised in the height direction (the Z direction shown in FIG. 6) to reduce the distance between the probe card PRC and the wafer WH.

Subsequently, the probe needles 2 and the electrode terminals 11 are brought into contact with each other, and then the distance between the probe card PRC and the wafer WH is further reduced. In other words, the probe needles 2 and the electrode terminals 11 are brought into contact with each other, and then external force is further applied in such a direction that the contact portions 2c of the probe needle 2 and the electrode terminal 11 become closer to each other. For the electrical test step, a thin insulating film such as a metal oxide film may be provided on a surface of the electrode terminal 11. In such a case, external force is further applied as described above, thereby the contact portions 2c and the electrode terminals 11 press each other. Hence, the metal oxide film is partially removed, so that the contact portions 2c can be securely brought into contact with the metal layers of the electrode terminals 11. While described in detail later, when this step is performed, the tip of the contact portion 2c of the probe needle 2 penetrates the electrode terminal 11. In addition, a position of the tip of the contact portion 2c travels while the contact portion 2c is in contact with the electrode terminal 11. Consequently, some of the surface of the electrode terminal 11 is shaved by the probe needle 2, and a groove is formed in the electrode terminal 11.

Subsequently, while the contact portion 2c is securely in contact with the electrode terminal 11, the electrical properties of the semiconductor element are tested. In this step, a signal for the test is supplied to the semiconductor element through the probe needle 2 to measure a current flowing through the semiconductor element and a voltage applied to the semiconductor element. In the exemplary case illustrated in FIG. 6, the back surface 12b of the semiconductor wafer WH is electrically coupled to the tester head THD via the inspection surface electrode BPL. In this case, for example, not only the probe needles 2 but also the inspection surface electrode BPL can be used as a path for supplying the signal for the test to the semiconductor element, or a path for measuring the current flowing through the semiconductor element and the voltage applied to the semiconductor element.

When the electrical properties of the semiconductor element have been tested, the distance between the probe card PRC and the wafer WH is increased. Subsequently, as described above, when the top surface 10t of the wafer WH as illustrated in FIG. 2 is partitioned into a plurality of inspection areas, the electrical test is in turn performed for each of the inspection areas while the relative position between the probe card PRC and the wafer WH is moved.

When the electrical test has been performed for all the inspection areas, the semiconductor wafer WH is removed from the wafer chuck WCH, and the semiconductor wafer WH is transferred to a subsequent step (for example, the individualization step in the exemplary case illustrated in FIG. 1)

Kelvin Connection

Figure 9:
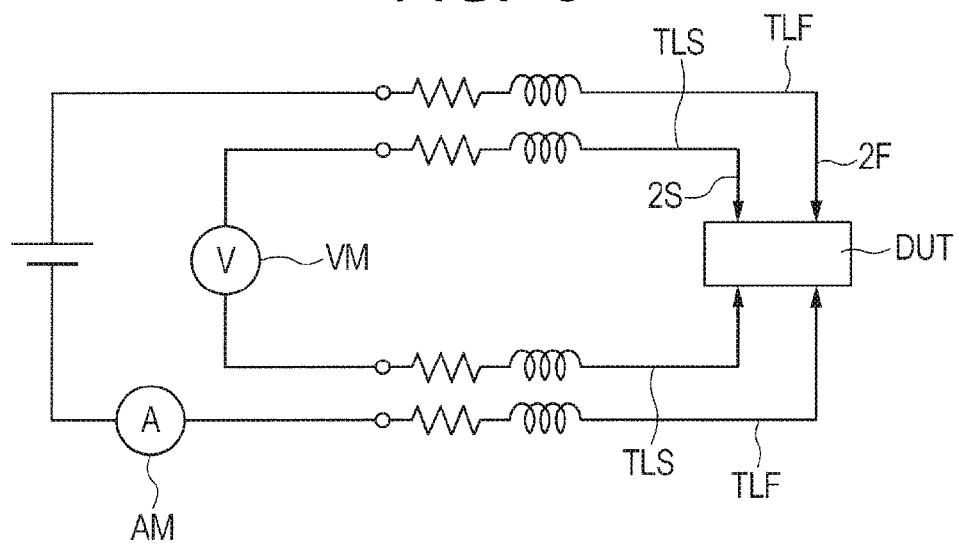
FIG. 9 is a circuit diagram illustrating a circuit for a test of impedance characteristics using the Kelvin connection.
Figure 10:
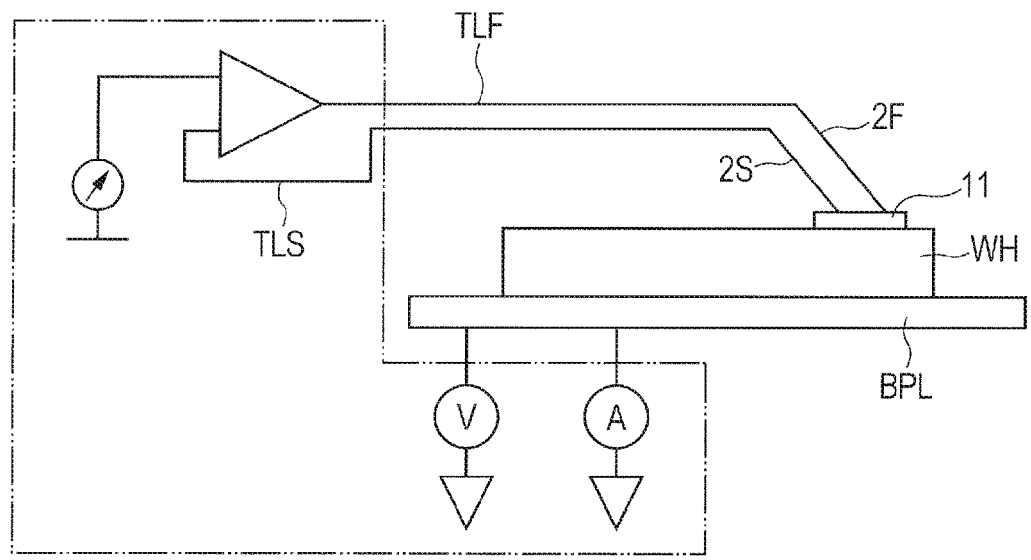
FIG. 10 is a schematic illustration schematically illustrating a situation where impedance characteristics of a semiconductor element formed in the semiconductor wafer illustrated in FIG. 2 are tested using the circuit illustrated in FIG. 9.

Description is now given on the electrical test using the Kelvin connection performed in the electrical test step of this embodiment. FIG. 9 is a circuit diagram illustrating a circuit for a test of impedance characteristics using the Kelvin connection. FIG. 10 is a schematic illustration schematically illustrating a situation where impedance characteristics of the semiconductor element formed in the semiconductor wafer WH illustrated in FIG. 2 are tested using the circuit illustrated in FIG. 9.

The Kelvin connection is a connection method, in which a current line TLF and a voltage detection line TLS are independently connected to a measurement object DUT. In the exemplary case illustrated in FIG. 9, the force terminal 2F is coupled to an end of the current line TLF, and the sense terminal 2S is coupled to an end of the voltage detection line TLS. When each of the force terminal 2F and the sense terminal 2S comes into contact with an electrode terminal of the measurement object DUT, the current line TLF and the voltage detection line TLS are independently coupled to the measurement object DUT. Since four terminals are coupled to the measurement object DUT, the Kelvin connection method (sometimes referred to as Kelvin double-bridge connection method) is also referred to as four-terminal connection method.

When the impedance characteristics are tested with the Kelvin connection circuit illustrated in FIG. 9, a voltage applied to the measurement object DUT is measured by a voltmeter VM, and a current flowing through the measurement object DUT is measured by an ammeter AM, and impedance (for example, a resistance) of the measurement object DUT is calculated from measurement results of the voltage and the current.

For a sufficiently large impedance of the measurement object DUT, contact resistance between the force terminal 2F or the sense terminal 2S and the measurement object DUT can be neglected. However, when the impedance of the measurement object DUT has a low value, for example, 10Ω or less, influence of the contact resistance between the force terminal 2F or the sense terminal 2S and the measurement object DUT must be eliminated.

For the Kelvin connection circuit illustrated in FIG. 9, if the internal resistance of the voltmeter VM is sufficiently large compared with the resistance of the measurement object DUT, substantially no current flows through the voltage detection line TLS. Hence, the voltage applied to the measurement object DUT and the current flowing therethrough can be accurately measured without being affected by the contact resistance between the contact terminal (the force terminal 2F or the sense terminal 2S) and the measurement object DUT. As described above, for the Kelvin connection circuit, it is possible that substantially no current flows through the voltage detection line TLS by adjusting the internal resistance of the voltmeter VM. Hence, the Kelvin connection circuit is also advantageous to a characteristic test in which a large current is applied to the measurement object DUT.

For the measurement object DUT having a small planar size, however, it is difficult to allow the force terminal 2F and the sense terminal 2S to independently come into contact with one object DUT. When the exposed area of the electrode terminal 11 illustrated in FIG. 10 is small, it is necessary to reduce the clearance between the tips of the contact portions 2c of the force terminal 2F and the sense terminal 2S illustrated in FIG. 7. If the clearance between the tips of the contact portions 2c of the force terminal 2F and the sense terminal 2S is reduced, the force terminal 2F readily comes into direct contact with the sense terminal 2S. During measurement of the current and the voltage by the Kelvin connection circuit illustrated in FIG. 9, if the force terminal 2F is in direct contact with the sense terminal 2S, the circuit is equivalent to a two-terminal connection circuit. This prevents elimination of influence of the contact resistance between the contact terminal (the force terminal 2F or the sense terminal 2S) and the measurement object DUT.

In other words, when the force terminal 2F and the sense terminal 2S illustrated in FIG. 8 are brought into contact with the electrode terminal 11 illustrated in FIG. 4 to perform the impedance characteristic test of the semiconductor chip 10, accuracy of impedance measurement can be improved by satisfying the following two conditions. The first condition is that the force terminal 2F and the sense terminal 2S are securely brought into contact with one electrode terminal 11. The second condition is that while the current and the voltage are measured, the force terminal 2F and the sense terminal 2S are separated from each other and are electrically coupled to each other by the electrode terminal 11.

In this embodiment, therefore, a technique that satisfies such two conditions has been investigated, and eventually the configuration of this embodiment has been found. The configuration is now described in detail with reference to the accompanying drawings.

Detailed Structure and Operation of Probe Needle

Figure 11:
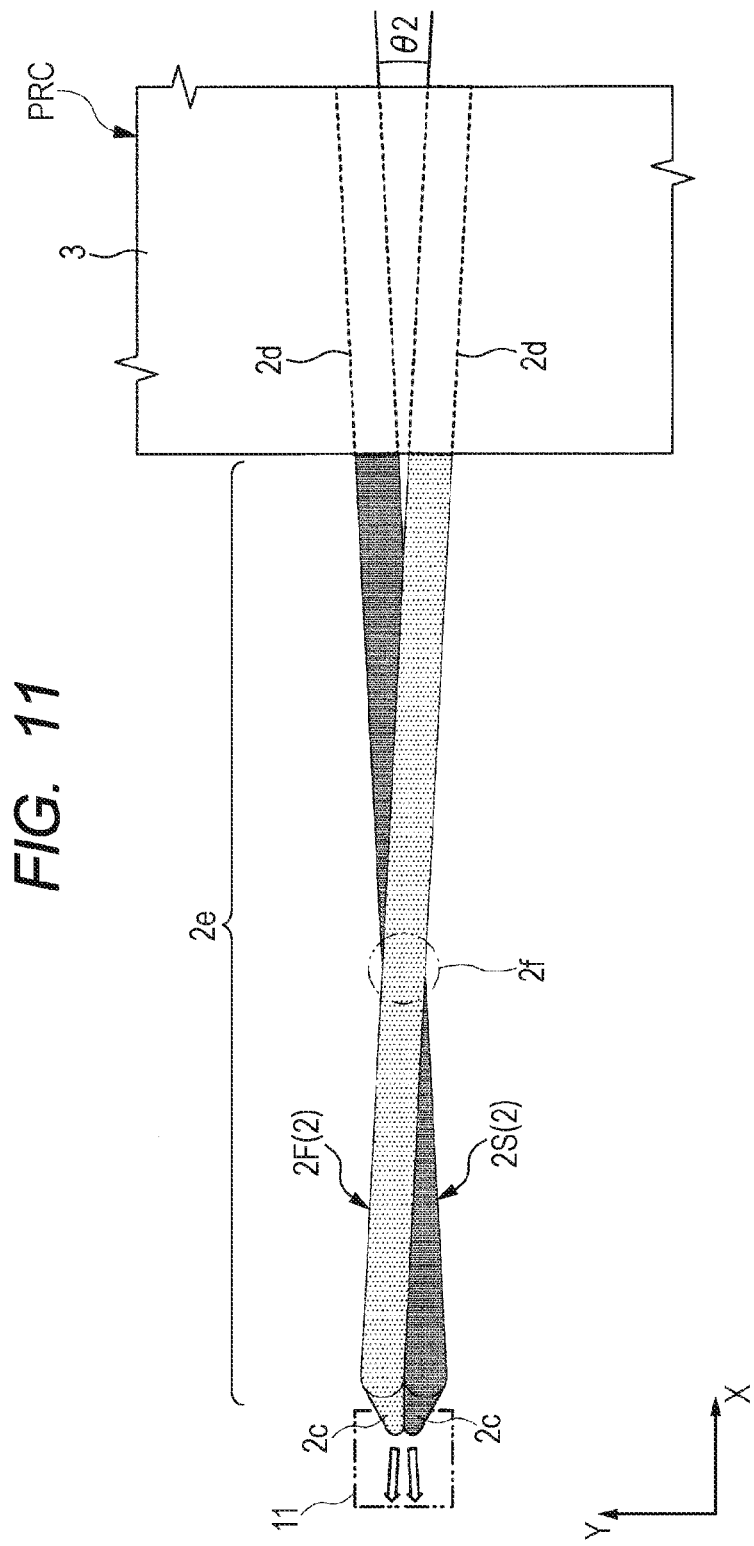
FIG. 11 is an expanded plan view illustrating a pair of terminals, i.e., a force terminal and a sense terminal, of one of a plurality of probe needles illustrated in FIG. 8.
Figure 12:
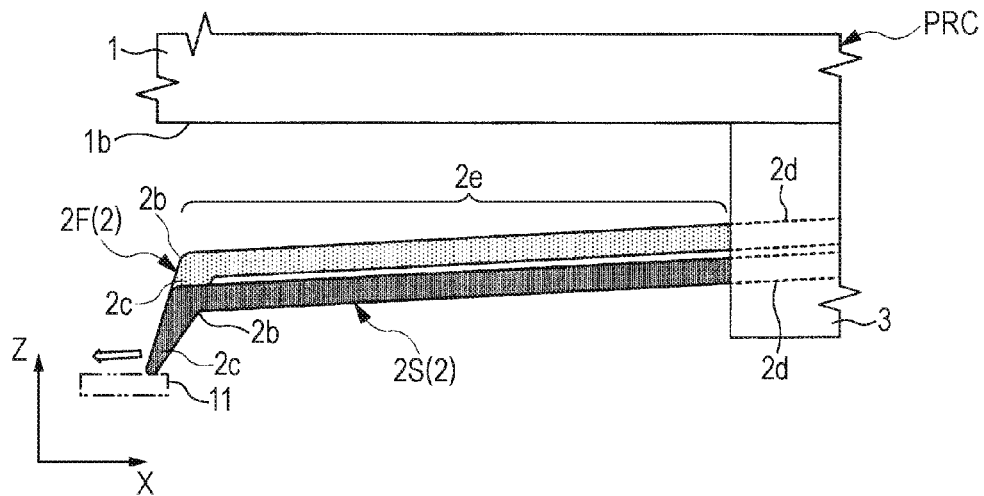
FIG. 12 is a side view of the probe needle illustrated in FIG. 11.
Figure 13:
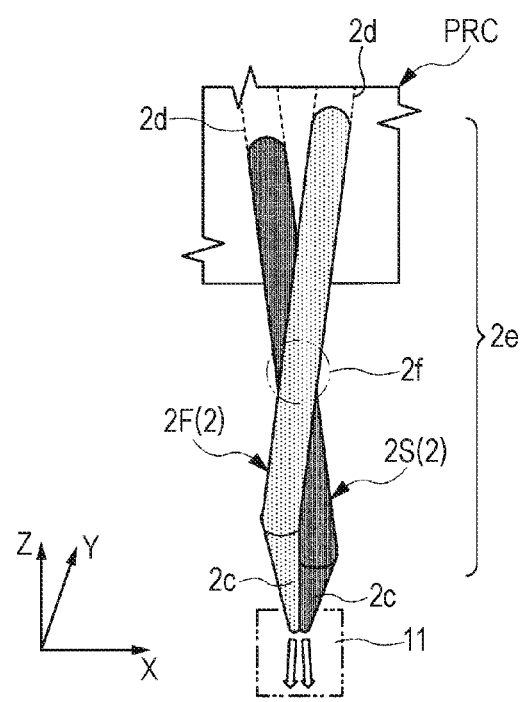
FIG. 13 is a perspective view of the probe needle illustrated in FIG. 11 as viewed from a contact portion at its end.
Figure 14:
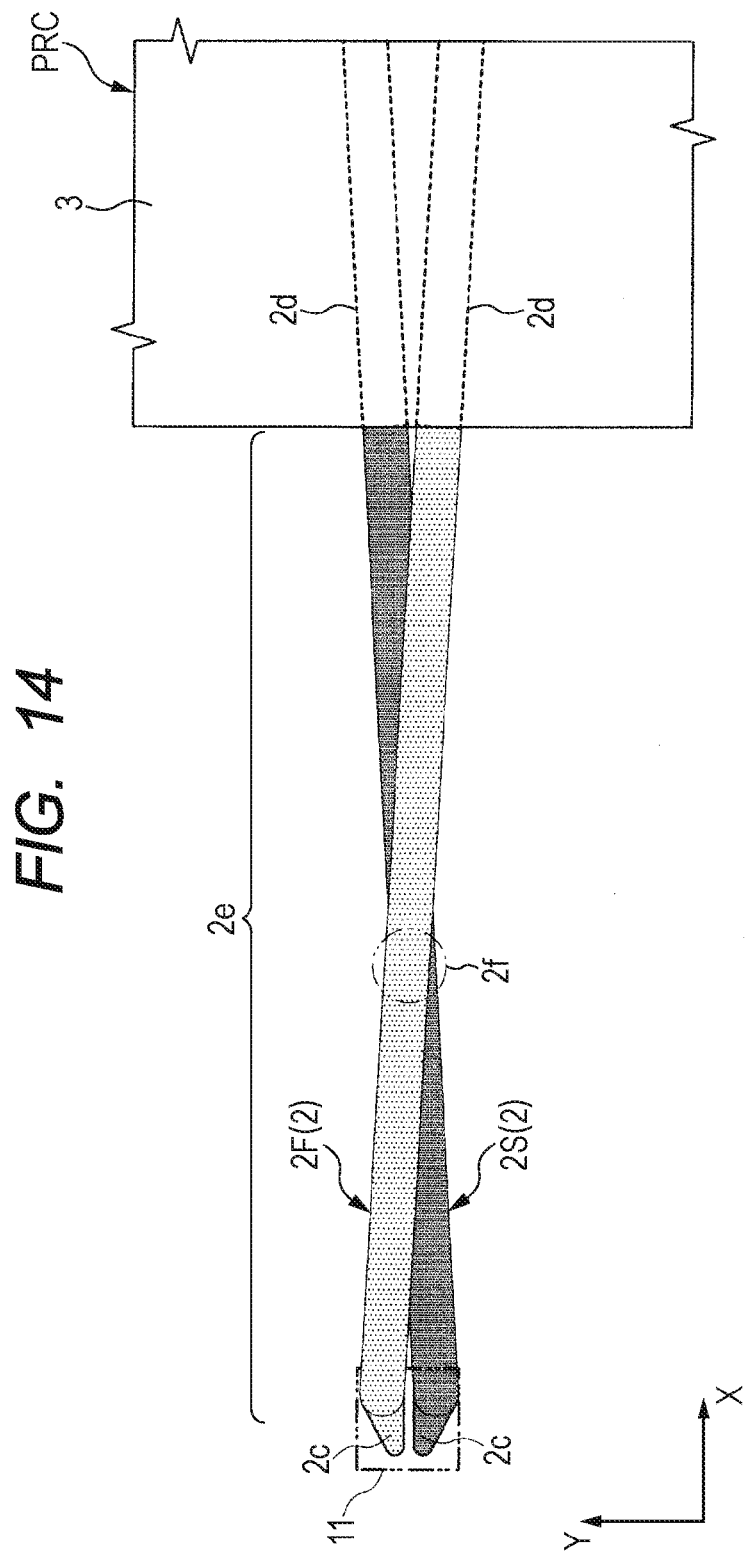
FIG. 14 is an expanded plan view illustrating a situation where the probe needle and the electrode terminal illustrated in FIG. 11 are brought into contact with each other, and then external force is further applied in such a direction that the probe needle and the electrode terminal approach each other.
Figure 15:
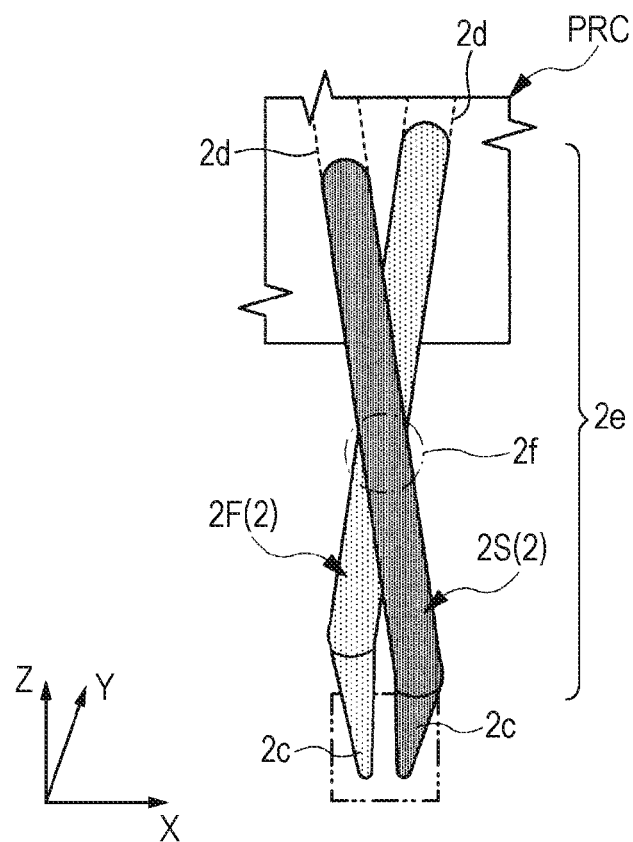
FIG. 15 is a perspective view of the probe needle illustrated in FIG. 14 as viewed from the contact portion at its end.
Figure 16:
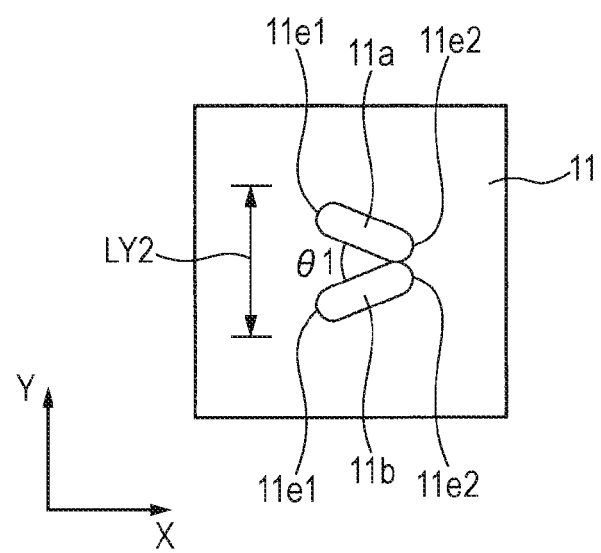
FIG. 16 is a plan view illustrating an exemplary surface of the electrode terminal subjected to an electrical test.

FIG. 11 is an expanded plan view illustrating a pair of terminals, i.e., the force terminal and the sense terminal, of one of the probe needles illustrated in FIG. 8. FIG. 12 is a side view of the probe needle illustrated in FIG. 11. FIG. 13 is a perspective view of the probe needle illustrated in FIG. 11 as viewed from the contact portion at its end. FIG. 14 is an expanded plan view illustrating a situation where the probe needle and the electrode terminal illustrated in FIG. 11 are brought into contact with each other, and then external force is further applied in such a direction that the probe needle and the electrode terminal approach each other. FIG. 15 is a perspective view of the probe needle illustrated in FIG. 14 as viewed from the contact portion at its end. FIG. 16 is a plan view illustrating an exemplary surface of the electrode terminal subjected to the electrical test.

As illustrated in FIGS. 11 to 13, each of the force terminal 2F and the sense terminal 2S provided in the probe card PRO of this embodiment has a needle held part 2d to be held by the bottom surface (contact terminal disposition surface) 1b (see FIG. 12) of the probe card PRC. In the exemplary case illustrated in FIGS. 11 to 13, the needle held part 2d is sealed and fixed (held) by the needle retainer 3 including, for example, a resin material. As illustrated in FIG. 7, the probe needles 2 are fixed at a position different from the position of the wiring connection 2a, which suppresses transmission of external force, which is generated at a timing when the probe needle 2 is brought into contact with a measurement object, to the wiring connection 2a. However, the fixation method of the needle held part 2d is not limited to a mode illustrated in FIG. 11, and includes various modifications of the mode. For example, for an undepicted probe card having a structure including no needle retainer 3 illustrated in FIG. 7, each of the probe needles 2 illustrated in FIG. 7 is fixed to (held on) the bottom surface 1b of the probe card PRC at the wiring connection 2a. In such a case, therefore, the wiring connection 2a also serves as the needle held part 2d (see FIG. 11)

As illustrated in FIGS. 11 to 13, each of the force terminal 2F and the sense terminal 2S provided in the probe card PRC of this embodiment has the contact portion 2c to be in contact with the electrode terminal Ii as a measurement object in the electrical test step. In the exemplary case illustrated in FIG. 12, each of the contact portions 2c extends from the folded portion 2b in a direction away from the bottom surface 1b of the interconnection substrate 1. In other words, each of the contact portions 2c extends downward from the folded portion 2b. Thus, each of the probe needles 2 has the contact portion 2c extending downward from the folded portion 2b, thereby positional accuracy is improved when the contact portion 2c is brought into contact with the electrode terminal 11.

As illustrated in FIGS. 11 to 13, each of the force terminal 2F and the sense terminal 2S provided in the probe card PRO of this embodiment has an extension 2e that is provided between the needle held part 2d and the contact portion 2c, and extends along the bottom surface 1b (see FIG. 12) of the probe card PRO (in detail, the interconnection substrate 1). In this way, the probe needle 2 has the extension 2e extending along the bottom surface 1b. In the electrical test step, when the contact portions 2c come into contact with the electrode terminal 11, and then external force is further applied in such a direction that the contact portions 2c and the electrode terminal 11 approach each other, the probe needle 2 operates as follows. That is, as schematically illustrated with arrows in FIGS. 11 to 13, while the contact portions 2c are in contact with the electrode terminal 11, a position of the tip of each contact portion 2c travels along the extending direction of the extension 2e.

The described "extension 2e extending along the bottom surface 1b of the probe card PRO" is not limited to the case of the extension 2e parallel to the bottom surface 1b, and is also given in the case of the extension 2e inclined with respect to the bottom surface 1b. For example, in the exemplary case illustrated in FIG. 12, the clearance between each extension 2e and the bottom surface 1b is smaller at a position closer to the needle held part 2d. From the viewpoint that the position of the tip of the contact portion 2c is easily moved along the extending direction of the extension 2e as above, however, the inclination angle of the extension 2e to the bottom surface 1b is preferably small. For example, in the exemplary case illustrated in FIG. 12, the contact portion 2c and the extension 2e are each inclined with respect to the bottom surface 1b of the probe card PRC. However, the angle defined by the extension 2e and the bottom surface 1b is smaller than the angle defined by the contact portion 2c and the bottom surface 1b.

As illustrated in FIGS. 11 and 13, the extensions 2e of the force terminal 2F and the sense terminal 2S intersect each other in a plan view. In other words, the force terminal 2F and the sense terminal 2S each have an intersection 2f at which the extensions 2e intersect each other in a plan view.

In this way, the extensions 2e of the force terminal 2F and the sense terminal 2S intersect each other. In such a case, in the electrical test step, when the contact portions 2c comes into contact with the electrode terminal 11, and then external force is further applied in such a direction that the contact portions 2c and the electrode terminal 11 approach each other, the force terminal 2F and the sense terminal 2S operate as follows. That is, as schematically illustrated with arrows in FIGS. 11 to 13, while the contact portions 2c are in contact with the electrode terminal 11, the tip portion (contact portion 2c) of the force terminal 2F and the tip portion (contact portion 2c) of the sense terminal 2S move in a direction away from each other.

As a result, as illustrated in FIGS. 14 and 15, there is given a state where the force terminal 2F and the sense terminal 2S are separated from each other, and are electrically coupled to each other by the electrode terminal 11. As illustrated in FIGS. 11 to 13, when the electrode terminal 11 and the probe needle 2 are still not in contact with each other, the contact portion 2c of the force terminal 2F is in contact with the contact portion 2c of the sense terminal 2S. However, the force terminal 2F and the sense terminal 2S other than the contact portions 2c are separated from each other. For example, the extensions 2e of the force terminal 2F and the sense terminal 2S are provided at different levels as illustrated in FIG. 12, and are thus separated from each other. The needles held part 2d of the force terminal 2F and the sense terminal 2S are adjacently provided with the needle retainer 3 in between, and are separated from each other. Hence, as illustrated in FIGS. 14 and 15, when the contact portions 2c of the force terminal 2F and the sense terminal 2S move so as to be separated from each other, the force terminal 2F is not in contact with the sense terminal 2S.

As illustrated in FIGS. 14 and 15, while the force terminal 2F and the sense terminal 2S are separated from each other and are electrically coupled to each other by the electrode terminal 11, the step of testing the electrical properties of the semiconductor element is performed. Consequently, the described two conditions for improving the impedance measurement accuracy are satisfied. In other words, the force terminal 2F and the sense terminal 2S can be securely brought into contact with one electrode terminal 11. During measurement of the current and the voltage, there is given a state where the force terminal 2F and the sense terminal 2S are separated from each other, and are electrically coupled to each other by the electrode terminal 11.

As described above, according to this embodiment, the two independent probe needles 2 can be securely brought into contact with one electrode terminal 11. In other words, the Kelvin connection circuit can be achieved. Hence, for example, measurement accuracy can be improved in impedance measurement or during an electrical test in which a large current is made to flow.

When the electrical test is performed in the above manner, for example, grooves (probe marks, contact terminal marks) 11a and 11b as illustrated in FIG. 16 are formed on the electrode terminal 11. Each of the grooves 11a and 11b has a first end 11e1 and a second end 11e2 located on a side opposite to the end 11e1 with an extension in between. A clearance between the first ends 11e1 of the grooves 11a and 11b is larger than a clearance between the second ends 11e2 thereof. In the exemplary case illustrated in FIG. 16, part of the groove 11a is in contact with part of the groove 11b. However, the grooves 11a and 11b may not be in contact with each other.

The force terminal 2F and the sense terminal 2S illustrated in FIG. 11 come into contact with the electrode terminal 11 at the ends 11e2 illustrated in FIG. 16. When external force is further applied in such a direction that the contact portions 2c of the probe needle 2 approaches the electrode terminal 11, the force terminal 2F and the sense terminal 2S travel to the ends 11e1 illustrated in FIG. 16. While the contact portions 2c (FIGS. 14 and 15) are in contact with the ends 11e1, the electrical properties of the semiconductor element are tested.

As described above, when the electrical test step is performed, the surface of the electrode terminal 11 may be covered with an insulating film such as a metal oxide film. In such a case, most of the grooves 11a and 11b illustrated in FIG. 16 are formed in the metal oxide film. Hence, after the individualization step illustrated in FIG. 1, the metal oxide film is removed by certain treatment before a conductive component such as a wire is coupled to the electrode terminal 11 of the semiconductor chip 10 (see FIG. 4). Consequently, most of the grooves 11a and 11b can be removed.

Figure 21:
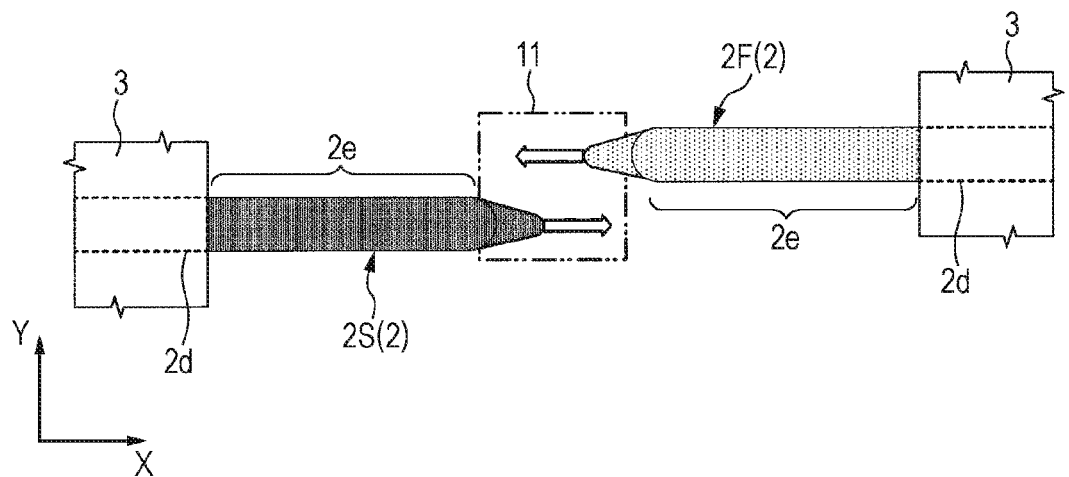
FIG. 21 is an expanded plan view illustrating a layout of the probe needles as an exemplary consideration of the layout of FIG. 11.
Figure 22:
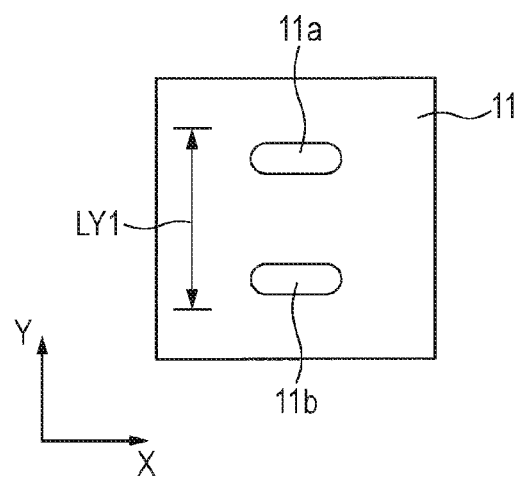
FIG. 22 is a plan view illustrating an exemplary surface of the electrode terminal subjected to an electrical test using the probe needles illustrated in FIG. 21.

In an exemplary consideration of this embodiment, the two probe needles 2 are brought into contact with one electrode terminal 11 while being not in contact with each other, which is provably accomplished by the following method. FIG. 21 is an expanded plan view illustrating a layout of the probe needles as an exemplary consideration of the layout in FIG. 11. FIG. 22 is a plan view illustrating an exemplary surface of the electrode terminal subjected to the electrical test using the probe needles illustrated in FIG. 21. In the exemplary consideration illustrated in FIG. 21, the extension 2e of the force terminal 2F and the extension 2e of the sense terminal 2S are configured to extend in opposite directions with respect to the respective contact portions 2c. In the configuration of the exemplary consideration, if the clearance between the force terminal 2F and the sense terminal 2S is sufficiently large, they are less likely to come into contact with each other. In the exemplary consideration illustrated in FIG. 21, however, a wide margin must be provided in order to prevent the force terminal 2F and the sense terminal 2S from being in contact with each other.

Specifically, in the exemplary case illustrated in FIG. 21, the extension 2e of the force terminal 2F and the extension 2e of the sense terminal 2S extend to the respective contact portions 2c from positions opposed to each other. In such a case, if a margin of positional accuracy is not provided for each of the force terminal 2F and the sense terminal 2S, the force terminal 2F may come into contact with the sense terminal 2S. For example, in the exemplary case illustrated in FIG. 22, it is defined that the grooves 11a and 11b each have a width of 10 μm and a margin of ±5 μm in a Y direction, and a design clearance is 5 μm between the grooves 11a and 11b. In this case, if the length LY1 in the Y direction of the electrode terminal 11 is less than 45 μm, the force terminal 2F and the sense terminal 2S illustrated in FIG. 21 may come into contact with each other.

In contrast, in this embodiment, as illustrated in FIGS. 11 to 15, the extension 2e of the force terminal 2F and the extension 2e of the sense terminal 2S extend in the same direction with respect to the respective contact portions 2c. Even if the force terminal 2F and the sense terminal 2S are in contact with each other immediately after they have come into contact with the electrode terminal 11, they then move in a direction away from each other. As a result, according to this embodiment, it is possible to reduce the margin for preventing the force terminal 2F and the sense terminal 2S from coming into contact with each other compared with the exemplary consideration illustrated in FIG. 21.

For example, it is defined that the grooves 11a and 11b illustrated in FIG. 16 each have a width of 10 µm, and a design clearance is 5 µm between the ends 11e1 of the grooves 11a and 11b. In addition, since the ends 11e2 of the grooves 11a and 11b may be in contact with each other as illustrated in FIG. 16, the grooves 11a and 11b can be regarded as one groove and thus should each have a margin of ±5 µm in the Y direction. As a result, if the length LY2 in the Y direction of the electrode terminal 11 illustrated in FIG. 16 is 30 µm or more, it is possible to prevent the force terminal 2F and the sense terminal 2S illustrated in FIG. 11 from being in contact with each other. That is, according to this embodiment, even if the electrode terminal 11 has small area, the two probe needles 2 can be securely brought into contact with the electrode terminal 11.

The clearance between the grooves 11a and 11b illustrated in FIG. 16 can be controlled by an angle θ1 defined by the grooves 11a and 11b. The angle θ1 illustrated in FIG. 16 substantially corresponds to an angle θ2 defined by the extension 2e of the force terminal 2F and the extension 2e of the sense terminal 2S in a plan view of FIG. 11. The angle θ1 illustrated in FIG. 16 and the angle θ2 illustrated in FIG. 11 are each preferably small from the viewpoint of decreasing the length LY2 in the Y direction illustrated in FIG. 16. For example, each of the angles θ1 and θ2 is preferably 3 to 10 degrees. The angle θ1 illustrated in FIG. 16 and the angle θ2 illustrated in FIG. 11 are each preferably large from the viewpoint of securely separating the force terminal 2F and the sense terminal 2S illustrated in FIG. 11 from each other during the electrical test. For example, each of the angles θ1 and θ2 is preferably 3 to 45 degrees.

Figure 17:
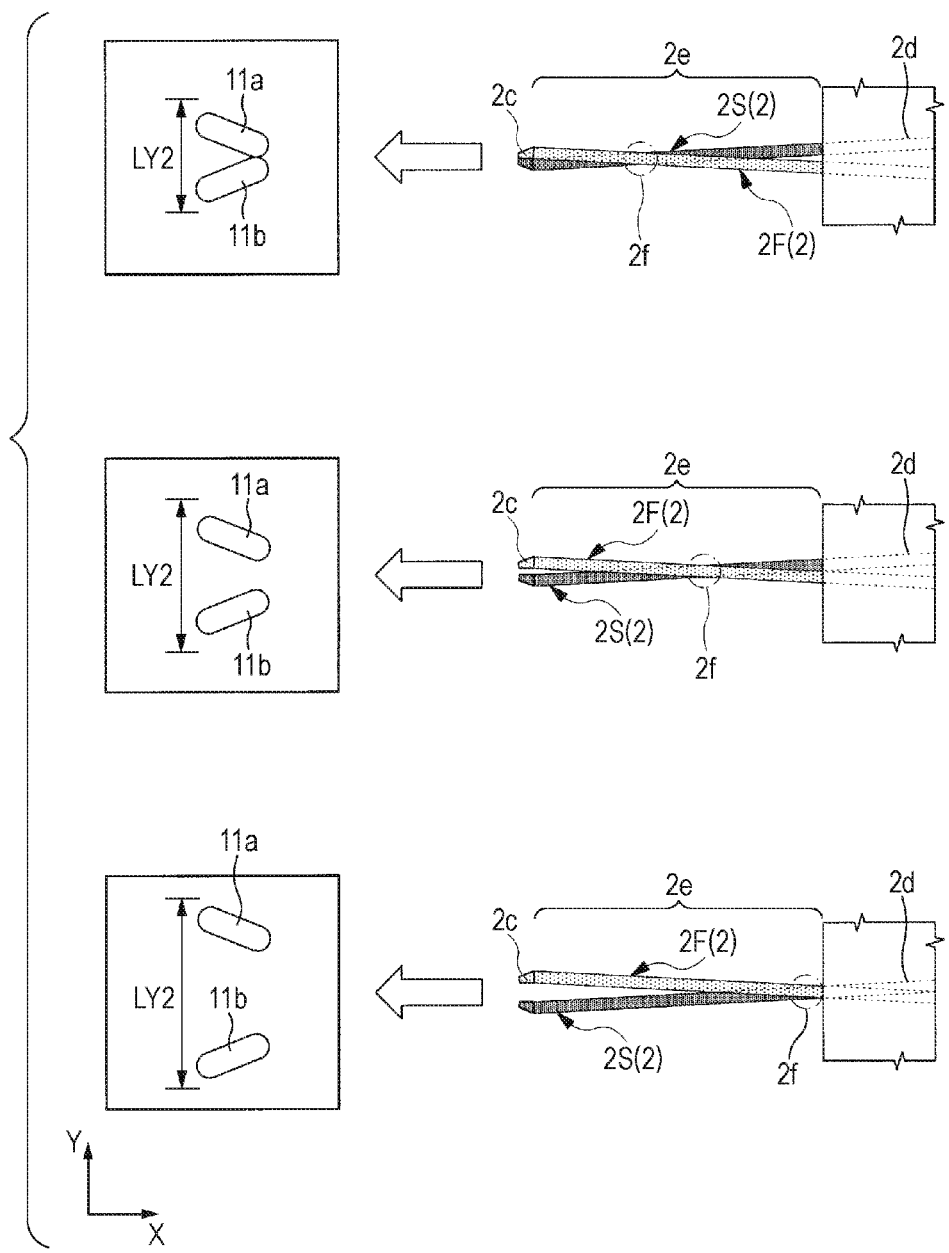
FIG. 17 is a schematic illustration schematically illustrating a relationship between a position of an intersection of two probe needles and a shape of each of grooves formed in the electrode terminal.

The length LY2 in the Y direction illustrated in FIG. 16 varies depending on positions of the intersection 2f illustrated in FIG. 11 even if the angle θ1 illustrated in FIG. 16 is fixed. FIG. 17 is a schematic illustration schematically illustrating a relationship between a position of the intersection of the two probe needles 2 and a shape of each of the grooves formed in the electrode terminal. In the exemplary case illustrated in FIG. 17, there are shown three cases having different positions of the intersection 2f. In the top case, the intersection 2f is provided at a position closer to the contact portion 2c than to the needle held part 2d in the extension 2e. In the middle case, the intersection 2f is provided near an intermediate position between the needle held part 2d and the contact portion 2c in the extension 2e. In the bottom case, the intersection 2f is provided at a position closer to the needle held part 2d than to the contact portion 2c in the extension 2e.

Through comparison between the lengths LY2 in the Y direction in the cases, the length LY2 becomes smaller as the position of the intersection 2f is closer to the contact portion 2c. FIG. 17 reveals the following. That is, even if the electrode terminal 11 has small area, the two probe needles 2 should be securely brought into contact with the electrode terminal 11. From such a viewpoint, the position of the intersection 2f is preferably closer to the contact portion 2c than to the needle held part 2d.

Figure 18:
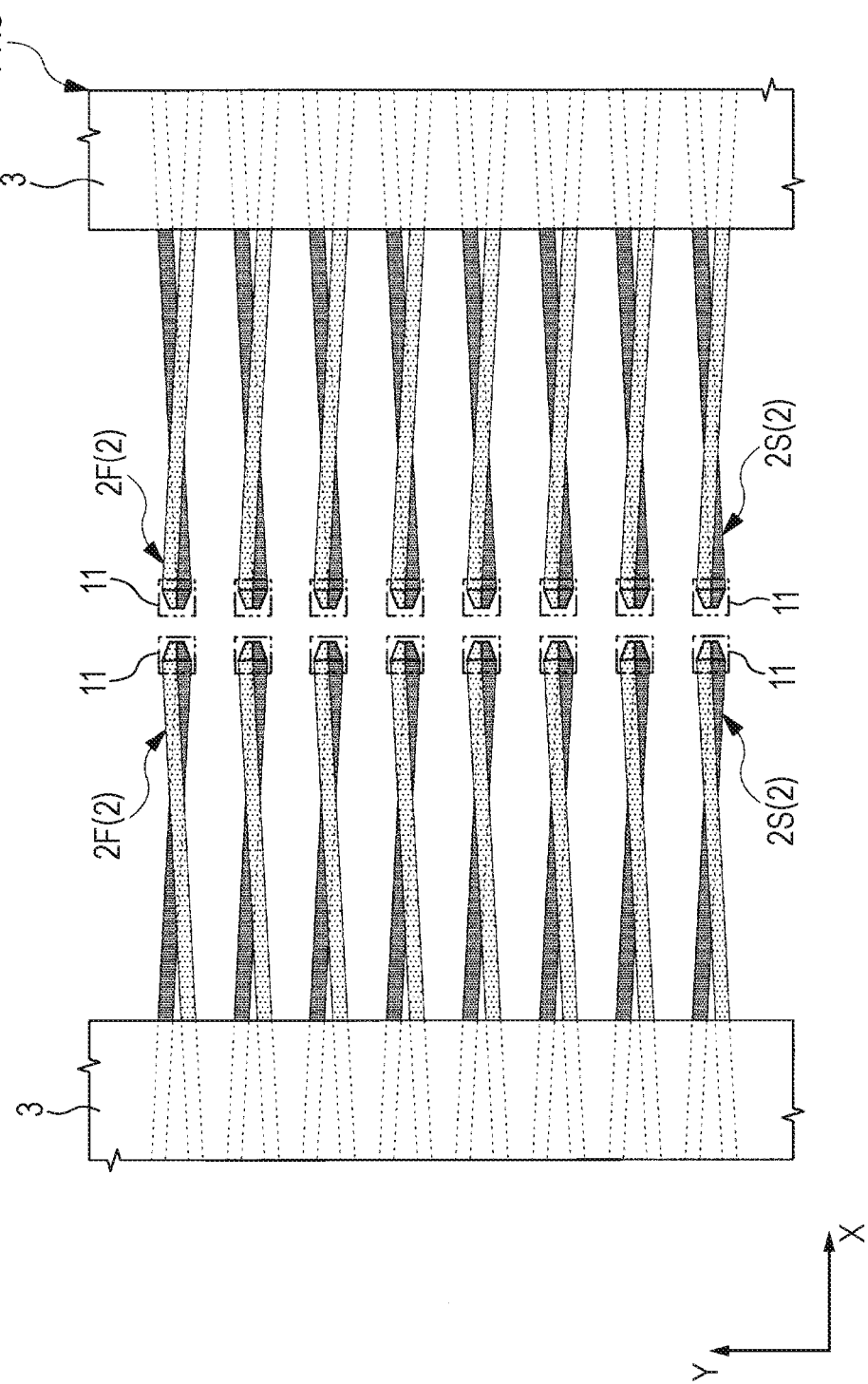
FIG. 18 is an expanded plan view illustrating a situation where a plurality of sets of a probe needle pair illustrated in FIG. 11 are provided, and an electrical test is collectively performed on a plurality of electrode terminals.

In this embodiment, the extension 2e of the force terminal 2F and the extension 2e of the sense terminal 2S extend in the same direction with respect to the respective contact portions 2c. This is advantageous to a collective test of the electrode terminals 11. FIG. 18 is an expanded plan view illustrating a situation where a plurality of sets of the probe needle pair illustrated in FIG. 11 are provided, and the electrical test is collectively performed on the electrode terminals.

When the electrical test is collectively performed on the electrode terminals 11 as illustrated in FIG. 18, and if each probe needle 2 is brought into contact with each of the electrode terminals 11 arranged in lines, the number of the electrode terminals 11 to be collectively tested can be increased. For example, in the exemplary case illustrated in FIG. 18, eight electrode terminals 11 are arranged in each of two lines, and thus the electrical test can be collectively performed on 16 electrode terminals 11 in total.

In the case of the layout of the probe needles 2 as illustrated in FIG. 21, since the probe needles 2 interfere with each other, it is difficult to collectively per form the electrical test on the electrode terminals 11 in lines. In this embodiment, as illustrated in FIG. 11, the extension 2e of the force terminal 2F and the extension 2e of the sense terminal 2S extend in the same direction with respect to the respective contact portions 2c. Consequently, as illustrated in FIG. 18, the probe needles 2 are prevented from interfering with each other, and the electrical test can be collectively performed on the electrode terminals 11 in lines. In the electrical test step of this embodiment, each of the probe needles 2 as contact terminals is brought into contact with each of the electrode terminals 11 on the semiconductor wafer WH (see FIG. 2) to collectively perform the electrical test on a plurality of semiconductor elements.

As described above, the semiconductor chip 10 of this embodiment includes a varicap diode element. In the electrical properties of the varicap diode, capacitance varies depending on voltages applied to a terminal of the varicap diode. Hence, the capacitance of the semiconductor chip 10 must be accurately measured in the electrical test step.

Figure 19:
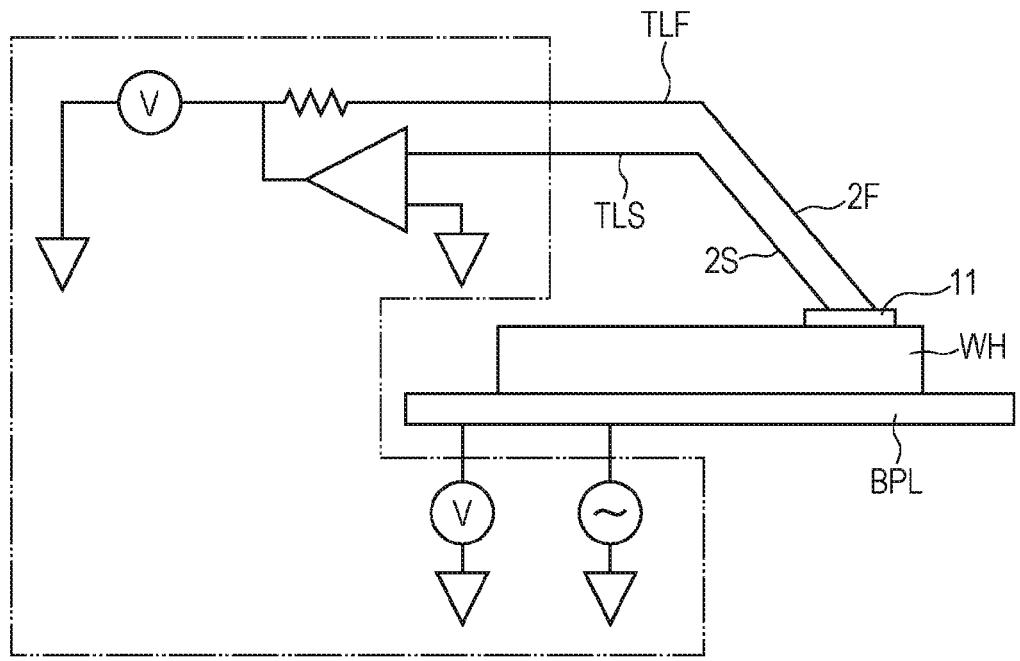
FIG. 19 is a schematic illustration schematically illustrating a circuit testing capacitance characteristics of the semiconductor element provided in the semiconductor wafer illustrated in FIG. 2.
Figure 20:
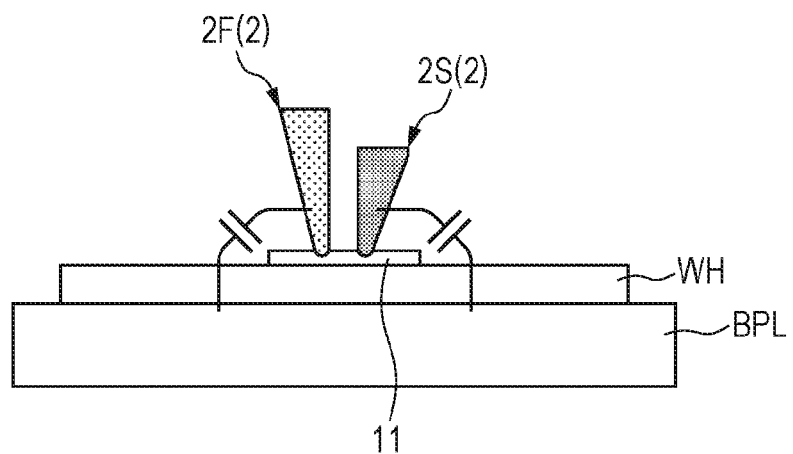
FIG. 20 is a schematic illustration schematically illustrating floating capacitance formed during the electrical test using the circuit illustrated in FIG. 19.

FIG. 19 is a schematic illustration schematically illustrating a circuit testing capacitance characteristics of the semiconductor element provided in the semiconductor wafer illustrated in FIG. 2. FIG. 20 is a schematic illustration schematically illustrating floating capacitance formed during the electrical test using the circuit illustrated in FIG. 19.

The capacitance of the semiconductor element as a measurement object can be measured using a self-balancing bridge circuit as illustrated in FIG. 19, for example. A capacitance value (capacitance) between parallel plates is obtained by the following formula:

$$C = \epsilon_0 \times S/d$$

where C is capacitance (F), $\epsilon_0$ is dielectric constant of vacuum (F/m), S is area of a polar plate (m$^2$), and d is a space between polar plates (m). The formula shows that capacitance between parallel polar plates varies directly with area of the polar plate and inversely with a distance between the polar plates. For the semiconductor wafer WH having a small thickness, therefore, as illustrated in FIG. 20, floating capacitance is formed between the inspection surface electrode BPL and the two probe needles 2. In particular, the capacitance must be corrected in consideration of influence of the floating capacitance in a measurement system in order to accurately test the capacitance characteristics.

To perform correction in consideration of influence of the floating capacitance, for example, the probe needles 2 are arranged at a height equal to the height in actual measurement while the semiconductor wafer WH illustrated in FIG. 20 is removed, and floating capacitance formed between the probe needles 2 and the inspection surface electrode BPL is measured. To measure the floating capacitance while the semiconductor wafer WH is removed, however, the sense terminal 2S and the force terminal 2F must be brought into contact with each other to configure a circuit (the self-balancing bridge circuit illustrated in FIG. 19) for measurement of floating capacitance.

As described above, the probe card PRC (see FIG. 11) of this embodiment has a structure where the probe needles 2 come into contact with the electrode terminal 11, and then the contact portions 2c of the two probe needles 2 move in a direction away from each other. Hence, the sense terminal 2S and the force terminal 2F may be in contact with each other as illustrated in FIG. 11 before the probe needles 2 come into contact with the electrode terminal 11.

The sense terminal 2S and the force terminal 2F are thus in contact with each other before the probe needles 2 come into contact with the electrode terminal 11. Consequently, the force terminal 2F and the sense terminal 2S illustrated in FIG. 19 can be shorted to each other; hence, floating capacitance can be measured while the wafer WH illustrated in FIG. 20 is removed. In actual measurement of the capacitance of the semiconductor element, therefore, the capacitance characteristics can be accurately determined in consideration of influence of the floating capacitance.

In this embodiment, the capacitance characteristics of the semiconductor element are determined. In such a case, it is particularly preferred to consider influence of the floating capacitance. However, the floating capacitance as illustrated in FIG. 20 is also formed for a test of electrical properties other than the capacitance characteristics. For measurement of the electrical properties in consideration of influence of the floating capacitance, therefore, the probe card is advantageously structured such that the sense terminal 2S and the force terminal 2F are in contact with each other before coming into contact with the electrode terminal 11 as illustrated in FIG. 11. However, when the floating capacitance is not measured, the force terminal 2F and the sense terminal 2S illustrated in FIG. 11 may not be in contact with each other.

In the exemplary case illustrated in FIG. 12, the extension 2e of the force terminal 2F and the extension 2e of the sense terminal 2S are provided at heights different from each other. Consequently, even if the extension 2e of the force terminal 2F and the extension 2e of the sense terminal 2S intersect each other, they are not in contact with each other. Although the extension 2e of the force terminal 2F is provided at a position (a position close to the bottom surface 1b) higher than the extension 2e of the sense terminal 2S, either of the force terminal 2F and the sense terminal 2S may be provided at a higher position.

According to this embodiment, the floating capacitance can be measured, and the two probe needles 2 can be brought into contact with the electrode terminal 11 to perform the electrical test while being separated from each other. Hence, tests of various electrical properties can be performed using one probe card PRC. In other words, even if tests of various electrical properties are performed, the probe card PRC may not be changed. Consequently, the electrical test step illustrated in FIG. 1 can be efficiently performed.

Modifications

Although the invention achieved by the inventors has been described in detail according to an embodiment thereof hereinbefore, the invention should not be limited thereto, and it will be appreciated that various modifications or alterations thereof may be made within the scope without departing from the gist of the invention.

Modification 1

For example, the above-described embodiment has been described with an embodiment, in which the electrical test is performed on the semiconductor wafer WH including the varicap diode element as an exemplary semiconductor element. However, the above-described technique can be applied not only to the electrical test of the semiconductor wafer including the varicap diode element, but also to tests of electrical properties of various semiconductor elements such as, for example, a transistor element.

Modification 2

For example, the above-described embodiment has been described with a layout of the probe needles 2 illustrated in FIGS. 11 to 13 as an exemplary configuration, in which the probe needles 2 come into contact with the electrode terminal 11, and then the force terminal 2F and the sense terminal 2S move in a direction away from each other. However, a configuration other than the layout illustrated in FIGS. 11 to 13 can also satisfy the two conditions for improving the accuracy of impedance measurement as described in the above-described embodiment, as long as it is ensured by the configuration that the probe needles 2 come into contact with the electrode terminal 11, and then the force terminal 2F and the sense terminal 2S move in a direction away from each other.

Modification 3

For example, the above-described embodiment has been described with an embodiment, in which the electrical properties of the semiconductor element are tested after the electrode terminal formation step as illustrated in FIG. 1. However, the electrical properties of the semiconductor element can be tested at any time after formation of the semiconductor element. For example, when the electrical test is performed before formation of the electrode terminal 11 illustrated in FIG. 3, the test can be performed while the semiconductor region 14 illustrated in FIG. 3 is used instead of the electrode terminal 11.

As described in the above-described embodiment, the test of the electrical properties of the semiconductor element may include not only the test of the electrical properties of the semiconductor element itself but also an electrical test of a circuit coupled to the semiconductor element. For example, such an electrical test includes a test of electrical properties of an interconnection path to be coupled to the semiconductor element.

Modification 4

Furthermore, the modifications may be combined within the scope without departing from the gist of the technical idea described in the above-described embodiment.

What is claimed is:

1. A method of manufacturing a semiconductor device, comprising the steps of:
    (a) fixing a semiconductor wafer onto a wafer holding stage, the semiconductor wafer including a first surface partitioned into a plurality of chip regions, semiconductor elements provided in the individual chip regions, and a plurality of electrode terminals that are electrically coupled to the semiconductor elements and exposed from the first surface;

(b) arranging a first card such that a contact terminal disposition surface is opposed to the first surface of the semiconductor wafer, the first card including an interconnection substrate having a plurality of first interconnections thereon, a plurality of contact terminals for contact with the electrode terminals, the contact terminal disposition surface holding the contact terminals, and a back surface located on a side opposite to the contact terminal disposition surface; and (c) allowing tips of the contact terminals of the first card to come into contact with the electrode terminals of the semiconductor wafer to perform an electrical test of the semiconductor element, wherein the contact terminals each have a first contact terminal that comes into contact with a first electrode terminal among the electrode terminals in the step (c), and a second contact terminal that intersects with the first contact terminal, and comes into contact with the first electrode terminal in the step (c), wherein each of the first contact terminal and the second contact terminal includes:

a needle held part that is held by the contact terminal disposition surface of the first card;

a contact portion that comes into contact with the first electrode terminal in the step (c); and an extension that is provided between the needle held part and the contact portion, and extends along the contact terminal disposition surface of the first card, wherein the extensions of the first contact terminal and the second contact terminal intersect with each other in a plan view.

2. The method according to claim 1, wherein in the step (c), impedance characteristics of the semiconductor element are tested.

3. The method according to claim 1, wherein the step (c) further includes the steps of:

(c1) allowing each of a tip portion of the first contact terminal and a tip portion of the second contact terminal to come into contact with the first electrode terminal while the tip portion of the first contact terminal and the tip portion of the second contact terminal are in contact with each other;

(c2) after the step (c1), moving the tip portion of the first contact terminal and the tip portion of the second contact terminal in a direction away from each other while the first contact terminal and the second contact terminal are each in contact with the first electrode terminal; and (c3) after the step (c2), performing the electrical test of the semiconductor element while the tip portion of the first contact terminal and the tip portion of the second contact terminal are separated from each other.

4. The method according to claim 3, wherein the step (c) includes the step of:

before the step (c1) or after the step (c3), measuring floating capacitance formed between the first contact terminal and the second contact terminal while the tip portion of the first contact terminal and the tip portion of the second contact terminal are in contact with each other.

5. The method according to claim 4, wherein the semiconductor element is a varicap diode element, and wherein the step (c3) includes the step of testing capacitance characteristics of the semiconductor element.

6. The method according to claim 5, wherein the step (c3) further includes the step of:

testing impedance characteristics of the semiconductor element.

7. The method according to claim 1, wherein an intersection at which the extensions of the first contact terminal and the second contact terminal intersect with each other is provided at a position closer to the contact portion than to the needle held part in the extension.

8. The method according to claim 1, wherein in the step (c), the respective contact terminals are allowed to come into contact with the electrode terminals of the semiconductor wafer to collectively perform the electrical test on a plurality of semiconductor elements.

9. A method of manufacturing a semiconductor device, comprising the steps of:

(a) fixing a semiconductor wafer onto a wafer holding stage, the semiconductor wafer including a first surface partitioned into a plurality of chip regions, semiconductor elements provided in the individual chip regions, and a plurality of electrode terminals that are electrically coupled to the semiconductor elements and exposed from the first surface;

(b) arranging a first card such that a contact terminal disposition surface is opposed to the first surface of the semiconductor wafer, the first card including an interconnection substrate having a plurality of first interconnections thereon, a plurality of contact terminals for contact with the electrode terminals, the contact terminal disposition surface holding the contact terminals, and a back surface located on a side opposite to the contact terminal disposition surface; and (c) allowing tips of the contact terminals of the first card to come into contact with the electrode terminals of the semiconductor wafer to perform an electrical test of the semiconductor element, wherein the contact terminals each have a first contact terminal that comes into contact with a first electrode terminal among the electrode terminals in the step (c), and a second contact terminal that intersects with the first contact terminal, and comes into contact with the first electrode terminal in the step (c), wherein the step (c) includes the steps of:

(c1) allowing each of a tip portion of the first contact terminal and a tip portion of the second contact terminal to come into contact with the first electrode terminal;

(c2) after the step (c1), moving the tip portion of the first contact terminal and the tip portion of the second contact terminal in a direction away from each other while the first contact terminal and the second contact terminal are each in contact with the first electrode terminal; and (c3) after the step (c2), performing the electrical test of the semiconductor element while the tip portion of the first contact terminal and the tip portion of the second contact terminal are separated from each other.

10. The method according to claim 9, wherein in the step (c1), each of the tip portion of the first contact terminal and the tip portion of the second contact terminal are allowed to come into contact with the first electrode terminal while the tip portion of the first contact terminal and the tip portion of the second contact terminal are in contact with each other.

11. The method according to claim 10, wherein the step (c) includes the step of:

before the step (c1) or after the step (c3), measuring floating capacitance formed between the first contact terminal and the second contact terminal while the tip portion of the first contact terminal and the tip portion of the second contact terminal are in contact with each other.

12. The method according to claim 11,
wherein the semiconductor element is a varicap diode element, and
wherein the step (c3) includes the step of:
testing capacitance characteristics of the semiconductor element.

13. The method according to claim 12, wherein the step (c3) further includes the step of:
testing impedance characteristics of the semiconductor element.

14. A probe card, comprising:
an interconnection substrate having a plurality of first interconnections thereon;
a plurality of contact terminals for contact with a plurality of electrode terminals provided on a semiconductor wafer;
a contact terminal disposition surface holding the contact terminals; and
a back surface located on a side opposite to the contact terminal disposition surface,
wherein the contact terminals each have a first contact terminal that comes into contact with a first electrode terminal among the electrode terminals, and a second contact terminal that intersects with the first contact terminal and comes into contact with the first electrode terminal,
wherein each of the first contact terminal and the second contact terminal includes:
a needle held part that is held by the contact terminal disposition surface;
a contact portion that comes into contact with the first electrode terminal; and
an extension that is provided between the needle held part and the contact portion, and extends along the contact terminal disposition surface,
wherein the extensions of the first contact terminal and the second contact terminal intersect with each other in a plan view.

15. The probe card according to claim 14, wherein an intersection at which the extensions of the first contact terminal and the second contact terminal intersect with each other is provided at a position closer to the contact portion than to the needle held part in the extension.

* * * * *